US009053404B2

(12) United States Patent
Finn

(10) Patent No.: US 9,053,404 B2
(45) Date of Patent: Jun. 9, 2015

(54) LASER-ABLATING MECHANICAL AND SECURITY FEATURES FOR SECURITY DOCUMENTS

(71) Applicant: David Finn, Tourmakeady County Mayo (IE)

(72) Inventor: David Finn, Tourmakeady County Mayo (IE)

( * ) Notice: Subject to any disclaimer, the term of this patent is extended or adjusted under 35 U.S.C. 154(b) by 0 days.

(21) Appl. No.: 13/934,456

(22) Filed: Jul. 3, 2013

(65) Prior Publication Data
US 2013/0299589 A1      Nov. 14, 2013

Related U.S. Application Data

(63) Continuation of application No. 12/901,590, filed on Oct. 11, 2010, now abandoned.

(60) Provisional application No. 61/259,224, filed on Nov. 9, 2009.

(51) Int. Cl.
*H01L 23/02* (2006.01)
*G06K 19/077* (2006.01)
*H01Q 1/22* (2006.01)

(52) U.S. Cl.
CPC ....... *G06K 19/0775* (2013.01); *Y10T 29/49016* (2015.01); *G06K 19/07749* (2013.01); *H01L 2224/78301* (2013.01); *H01Q 1/2225* (2013.01); *G06K 19/07798* (2013.01)

(58) Field of Classification Search
CPC ............... H01L 2924/01079; H01L 2924/00; H01L 2924/15; H01L 2924/19; H01L 2924/1901; H01L 2924/19105; H01L 2224/94; H01L 2224/97; H01L 2224/78301; B65B 15/04; B65B 61/007; B65B 61/02; B65B 61/12; G06K 19/0775; G06K 19/07749; G06K 19/07798
USPC ......... 257/676, 679, 684, 687, 669, 667, 668; 53/452, 456
See application file for complete search history.

(56) References Cited

U.S. PATENT DOCUMENTS

| | | | |
|---|---|---|---|
| 3,926,746 A * | 12/1975 | Hargis .......................... | 205/128 |
| 4,340,774 A * | 7/1982 | Nilsson et al. ............. | 174/138 G |
| 5,854,741 A * | 12/1998 | Shim et al. ..................... | 361/813 |
| 5,886,398 A * | 3/1999 | Low et al. ..................... | 257/667 |
| 6,115,262 A * | 9/2000 | Brunner et al. ............... | 361/774 |
| 6,316,736 B1 * | 11/2001 | Jairazbhoy et al. .......... | 174/260 |
| 7,723,855 B2 * | 5/2010 | Tsai et al. ..................... | 257/786 |
| 8,779,565 B2 * | 7/2014 | Han et al. ...................... | 257/667 |

* cited by examiner

*Primary Examiner* — Cathy Lam
(74) *Attorney, Agent, or Firm* — Gerald E. Linden

(57) ABSTRACT

Channels may be formed in the inlay substrate of a transponder, such as by laser ablation, and the antenna wire may subsequently be laid in the channels. Laying the wire in a channel ensures that it substantially fully embedded in the substrate, thereby eliminating a need for pressing the wire into the substrate. The channels may be tapered, or profiled, to enhance adhesion of a self-bonding wire. A recess for the chip module can also be formed using laser ablation, and insulation may be removed from end portions of the antenna wire using laser ablation. Laser ablation may also be used to create various mechanical and security features.

17 Claims, 12 Drawing Sheets

Laser Ablation

Gouging

Ultrasonic Stamp

Heat/Mold

Installing a Wire in a Channel

Channel Crossings

LASER-ABLATING MECHANICAL AND SECURITY FEATURES FOR SECURITY DOCUMENTS

CROSS-REFERENCE TO RELATED APPLICATIONS

This is a continuation of 12/901,590 filed Oct. 11, 2010 which claims priority from 61/259,224 filed Nov. 9, 2009.

TECHNICAL FIELD

The invention relates to "inlay substrates" used in the production of "inlays" for "security documents" such as electronic passports, electronic ID cards and smart cards and, more particularly, to forming mechanical and safety features for security documents, using laser ablation.

BACKGROUND

Transponders are electronic devices incorporated into secure documents such as "smart cards" and "electronic passports" using RFID (radio frequency identification) technology.

The transponder (or inlay, or chip card) itself generally comprises (includes):
 a substrate (or inlay substrate) which may comprise a sheet of a synthetic material;
 a chip (or chip module, or chip unit) installed on the substrate (or in a recess in the surface of the substrate) and having terminals (or contact surfaces, or pads); and
 an antenna wire (or conductor) mounted on the substrate, formed with "turns" as a flat coil and connected (bonded) by its ends or end portions to the terminals of the chip module. (In some of the drawings presented herein, only one end or end portion of the antenna wire may be shown, for illustrative clarity, particularly in the cross-sectional views.)

The inlay substrate may comprise one or more layers of PVC, Polycarbonate (PC), polyethylene (PE), PET (doped PE), PETE (derivative of PE), TYVEK, Teslin™, Paper or Cotton/Noil, and the like. For example, a single layer of uncoated Teslin™, with a thickness of 356 microns. In the main hereinafter, inlay substrates comprising Teslin™ or polycarbonate (PC) will be described.

Teslin™ is a synthetic printing media, manufactured by PPG Industries. Teslin™ is a waterproof synthetic material that works well with an Inkjet printer, Laser printer, or Thermal printer. Teslin™ is also single-layer, uncoated film, and extremely strong. In fact, the strength of the lamination peel of a Teslin™ sheet is 2-4 times stronger than other coated synthetic and coated papers. Teslin™ comes in the sizes of 7 mil to 18 mil, though only sizes 10 mil and 14 mil are sized at 8.5" by 11", for printing with most consumer printers. Also available are perforated versions of Teslin, specifically, 2up, 6up, and 8up. Teslin™ is a microporous polymer. Polycarbonate (PC) is typically used for national ID cards, and also as the material in certain passports (such as for the Datapage, in contrast to the e-Cover).

The inlay substrate may have an area designated as a "transponder site" whereat the chip module will be installed. (A recess in the inlay substrate may constitute the transponder site.) The transponder site may itself have two areas designated as "terminals areas" corresponding in position to the two terminals of the chip module which will be installed at the transponder site. (The transponder site and terminal areas are generally geometric abstractions, the chip module and terminals are physical elements.) Hence, it should be understood that, where applicable, the terms (and reference numerals for) "transponder site" and "chip module" may be used interchangeably, and that the terms "terminal areas" and "terminals" may similarly be used interchangeably.

In the main hereinafter, RFID chips incorporated into chip modules will be described. The chip module may be a leadframe-type chip module comprising an RFID chip encapsulated by a mold mass and supported by and connected to a leadframe having two terminal areas.
 the mold mass may be approximately 240 µm thick and 5 mm wide
 the leadframe may be approximately 80 µm thick and 8 mm wide.

The chip module may be disposed in a recess extending into the surface of the substrate measuring for example 5.5 mm wide×8.5 mm high (generally the recess is only slightly larger than the chip module to allow some clearance during installation, while maintaining good registration).

The recess for receiving the chip module extends into the inlay substrate from a "top" surface thereof, and may be a "window" type recess extending completely through the inlay substrate to a "bottom" surface thereof, or the recess may be a "pocket" type recess extending only partially through the inlay substrate towards the bottom surface thereof.

The recess may have a "straight" profile—in other words, substantially constant cross-dimension through (or into) the inlay substrate. Or, the recess may have a "stepped" profile, including a larger cross-dimension at the top surface of the substrate than at (or towards) the bottom surface of the inlay substrate. The recess is generally sized and shaped to accommodate the size and shape of the chip module being disposed therein. The term "cavity" may be used interchangeably with "recess". A stepped recess profile is commonly used to accommodate a leadframe module, since the leadframe is typically wider (8-10 mm) than the mold mass (4-6 mm) of the chip module.

The antenna wire can be self-bonding copper wire or partially coated self-bonding copper wire, enamel copper wire or partially coated enamel wire, silver coated copper wire, uninsulated wire, aluminum wire, doped copper wire or litz wire.

The conventional method of mounting the wire is using a sonotrode tool which vibrates, feeds the wire out of a capillary, and embeds it into the surface of the substrate. Examples of embedding a wire in a substrate, in the form of a flat coil, and an ultrasonic tool for performing the embedding (and a discussion of bonding), may be found in U.S. Pat. No. 6,698,089 (refer, for example, to FIGS. 1, 2, 4, 5, 12 and 13 of the patent). See also FIGS. 1 and 2 of U.S. Pat. No. 6,233,818. Both of these patents are incorporated by reference herein. It is also known that a coated, self-bonding wire will stick to a synthetic (e.g., plastic) substrate because when vibrated sufficiently to soften (make sticky) the coating and the substrate.

The conventional method for connecting the ends or end portions of the antenna wire to the terminals (or "terminal areas") of the chip module is by means of thermo compression (TC) bonding. This method makes use of heat by passing pulses of electric current through a thermode and simultaneously applying pressure to cause a diffusion process between the wire and the leadframe of the chip module.

FIGS. 1A and 1B illustrate an example of a prior art technique, such as is disclosed in U.S. Pat. No. 6,233,818 for mounting an antenna wire to an inlay substrate and connecting the antenna wire to a chip module installed in a recess in the inlay substrate.

An inlay sheet 100 is a large inlay substrate which may have a plurality of transponder areas (or sites) 102, a one of which is shown in some detail. Typically, several transponders (or transponder sites) are fabricated on a single inlay sheet.

A recess 106 is formed in the inlay substrate 102 for receiving a leadframe type chip module 108, positioned as shown, with the mold mass 112 situated below the leadframe 114. The leadframe 114 of the chip module 108 has two terminal areas 108a and 108b. An antenna wire 110 having two ends (or end portions) 110a and 110b is mounted on the substrate and connected to the terminal areas 108a and 108b of the chip module 108.

The wire may is mounted to the substrate using an ultrasonic embedding tool such as a sonotrode having a capillary 116. Mounting the antenna wire may proceed as follows:

- using the sonotrode, embed the wire a short distance, between the points "a" and "b" near a first terminal of the chip module. (embedding is indicated by the symbols "x")
- stop embedding (raise the sonotrode), and pass over the first terminal of the chip module, between the points "b" and "c".
- lower the sonotrode and resume embedding at the point "c", and form the turns of the antenna between the points "c" and "d" (embedding is indicated by the symbols "x") there may be for example 4 or 5 turns, and the overall length of the antenna wire may be 104 cm
  - notice that in forming the turns of the antenna, the wire may need to cross over itself, thus requiring an insulated wire. However, in some cases, the antenna wire does not need to cross over itself. See, for example, FIG. 4 of U.S. Pat. No. 6,698,089.
- after approaching near the second terminal of the chip module, stop embedding and pass over the second terminal of the chip module, between the points "d" and "e".
- resume embedding a short distance on the opposite side of the chip module, between the points "e" and "f".

The embedding process may be discontinuous, at several points, rather than continuous.

In a next stage of the process, the "connection" portions of the wire passing over the terminal areas are interconnected to the terminal areas of the RFID chip, typically by means of thermo compression bonding. A thermode 118 for performing bonding is illustrated. It is known to remove insulation from the connection portions of the antenna wire to improve bonding.

In the case of Teslin (synthetic paper), a normal insulated wire would not properly embed into the material, it would detach. Therefore, it is known to use self-bonding wire which attaches to the material with a slight penetration of the wire in the material.

A self-bonding (or self-adhering) wire may comprise
- a metallic core (typically, but not necessarily round in cross-section) comprising copper, aluminum, doped copper, gold, or Litz wire, and may have a diameter of 0.010-0.50 mm
- a first coating or "base coat" comprising modified polyurethane, and having a thickness of only a few microns
- a second coating comprising polyvinylbutyral or polyamide, and having a thickness of only a few microns.

The transponder thus formed on the inlay substrate may be incorporated, for example, in an electronic passport cover. The material for the cover layer of the passport may be a cloth product, with chemistry in the coatings and a leather-like appearance to the cloth, such as by Holliston Inc. (905 Holliston Mills Road, Church Hill, Tenn. 37642; www.holliston.com)

FIG. 1C shows a passport cover having a cover layer and an inlay substrate. The cover layer is laminated (joined) to the inlay substrate using a polyurethane hot melt adhesive, such as approximately 50-80 μm thick. Prior to the adhesive process, the inlay substrate may be pre-pressed to ensure that the antenna wire does not protrude over (extend above) the surface of the Teslin™ substrate, in other words, to ensure that the antenna wire is fully embedded in the inlay substrate.

SUMMARY

According to the invention, generally, channels may be formed in the inlay substrate of a transponder, such as by laser ablation, and the antenna wire may subsequently be laid in the channels. Laying the wire in a channel ensures that it substantially fully embedded in the substrate, thereby eliminating a need for pressing the wire into the substrate. The channels may be tapered, or profiled, to enhance adhesion of a self-bonding wire. A recess for the chip module can also be formed using laser ablation, and insulation may be removed from end portions of the antenna wire using laser ablation. Laser ablation may also be used to create various mechanical and security features.

More specifically, laser ablation may be used to ablate material from an inlay substrate of a secure document, such as for (i) creating a recess (cavity or pocket) to accommodate a chip or chip module and/or
(ii) forming grooves or trenches in the substrate or film to accept a wire conductor which may serve as the antenna of a transponder incorporated into the secure document
(iii) forming mechanical (such as stress relief) and security (anti-tampering) features Laser ablation causes the removal of material from a substrate. More generally, many of the features described herein can be achieved via photochemical and photothermal response of the substrate material to laser irradiation. In other words, material of the substrate could be photochemically and photothermally activated material at the time of laying the wire down.

According to an embodiment of the invention, a method of mounting an antenna wire to a surface of a substrate for a transponder chip comprises: forming a channel in the surface of the substrate for accepting the antenna wire; laying a self-bonding antenna wire into the channel; and while laying the antenna wire into the channel, performing one or more of thermally or electrically warming the wire, or activating an adhesive layer of the wire by chemically. The channel may be formed by laser ablation of the substrate material. The substrate may be frozen during performing laser ablation. The substrate may comprise polymer material, or a porous material or a non-porous material or Teslin™. The channel may be formed with a single or with multiple passes of the laser. The channel may be U-shaped. The channel may be formed by a mechanical tool, or by a hot mold process. The channel may have as a depth which is less than a diameter of the wire, and as the wire is laid down into the channel, it is pressed further into the substrate. The channel may be formed by removing material from the substrate. A recess for receiving a chip module in the substrate may be formed in conjunction with laser ablation of the channels, and the recess may be a stepped recess. The channel (or channels) may extend from an edge of the recess.

According to an embodiment of the invention, an edge region of the inlay substrate may be thinned using laser ablation. Studs may be formed in the thinned region for inserting into holes of a separate element in the thinned edge region. Holes may be formed in the thinned region for receiving studs of a separate element in the thinned edge region.

BRIEF DESCRIPTION OF THE DRAWINGS

Reference will be made in detail to embodiments of the disclosure, examples of which may be illustrated in the accompanying drawing figures (FIGURES). The figures are intended to be illustrative, not limiting. Although the invention is generally described in the context of these embodiments, it should be understood that it is not intended to limit the invention to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

Figure 1A:
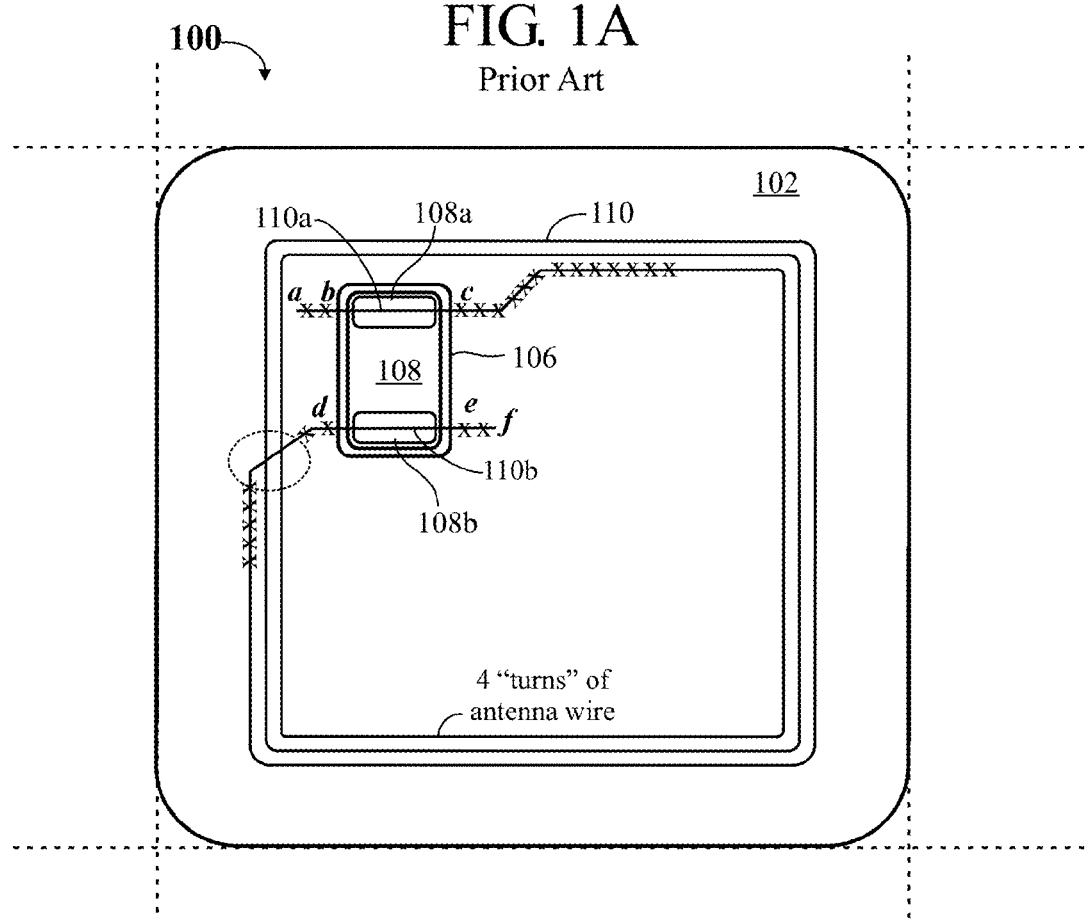

If shading or cross-hatching is used, it is intended to be of use in distinguishing one element from another (such as a cross-hatched element from a neighboring un-shaded element). It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

FIG. 1A is a top view of a transponder site (one of many on an inlay sheet), according to the prior art.

Figure 1B:
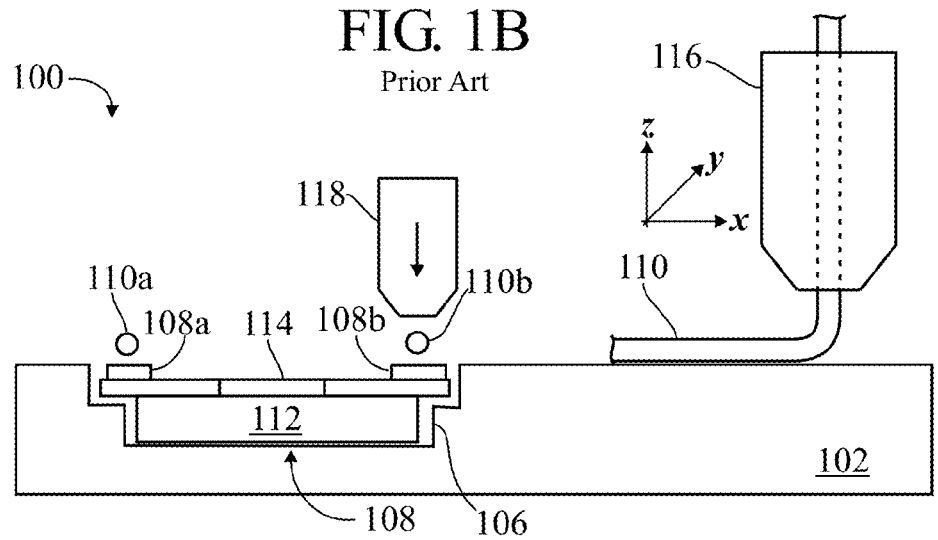

FIG. 1B is a side, cross-sectional view, partially exploded, of a wire being mounted to an inlay substrate and bonded to the terminals of a transponder chip, according to the prior art.

Figure 1C:
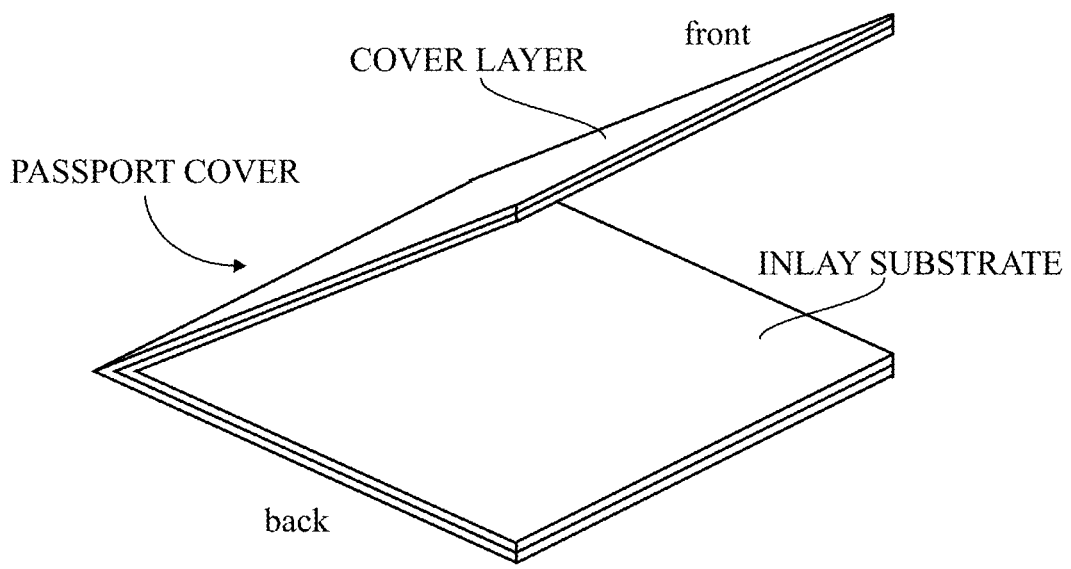

FIG. 1C is a perspective view of a secure document which is an electronic passport cover, according to the prior art.

Figure 1D:
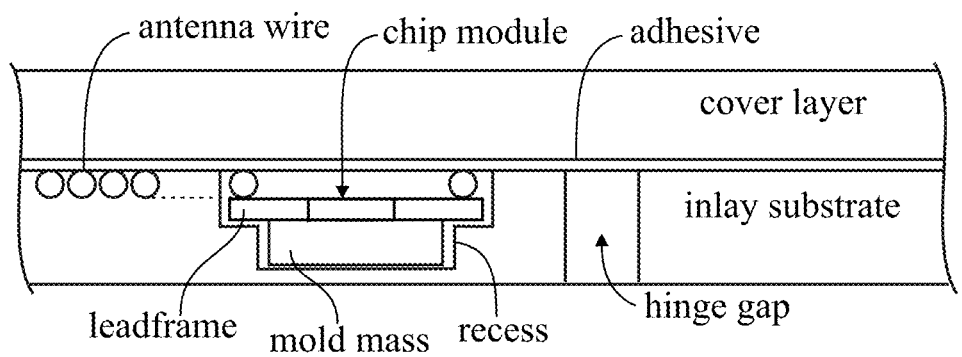

FIG. 1D is a cross-sectional view of the secure document of FIG. 1C, according to the prior art.

Figure 2A:
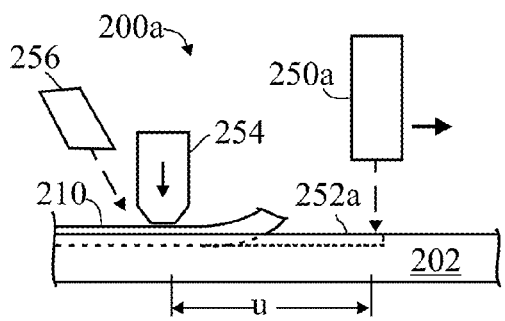

FIG. 2A is a cross-sectional view illustrating a technique for creating channels for mounting an antenna wire in an inlay substrate, according to an embodiment of the invention.

Figure 2B:
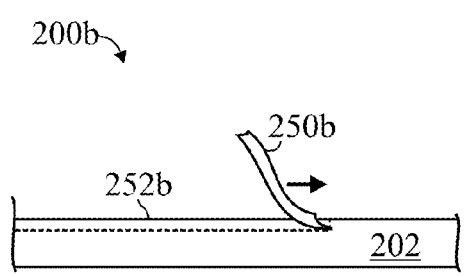

FIG. 2B is a cross-sectional view illustrating a technique for creating channels for mounting an antenna wire in an inlay substrate, according to an embodiment of the invention.

Figure 2C:
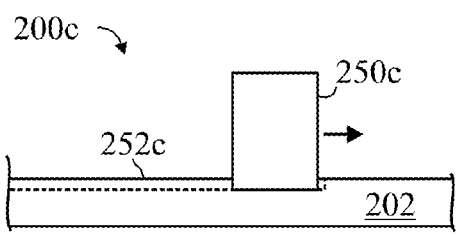

FIG. 2C is a cross-sectional view illustrating a technique for creating channels for mounting an antenna wire in an inlay substrate, according to an embodiment of the invention.

Figure 2D:
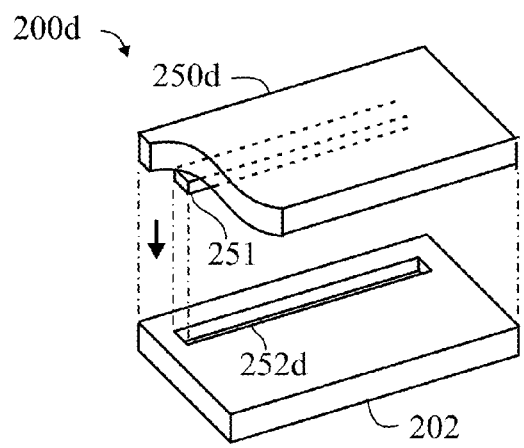

FIG. 2D is a perspective view illustrating a technique for creating channels for mounting an antenna wire in an inlay substrate, according to an embodiment of the invention.

Figure 2E:
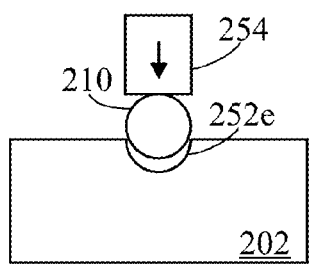

FIG. 2E is a cross-sectional view illustrating mounting an antenna wire in a channel, according to an embodiment of the invention.

Figure 3A:
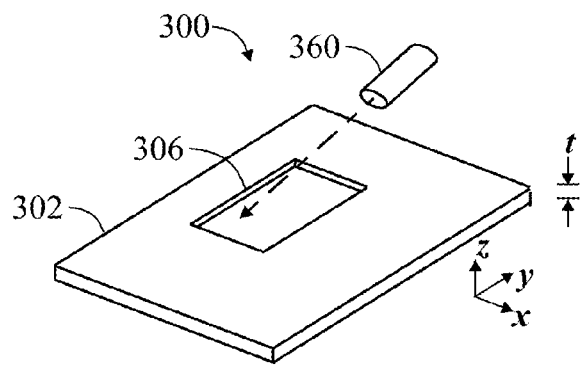

FIG. 3A is a perspective view illustrating a technique for forming a recess in an inlay substrate using laser ablation, according to an embodiment of the invention.

Figure 3B:
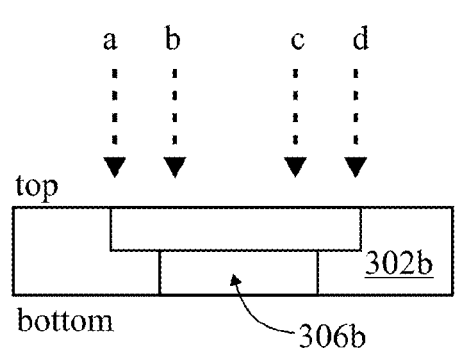

FIG. 3B is a cross-sectional view illustrating a technique for forming a recess in an inlay substrate using laser ablation, according to an embodiment of the invention.

Figure 3D:
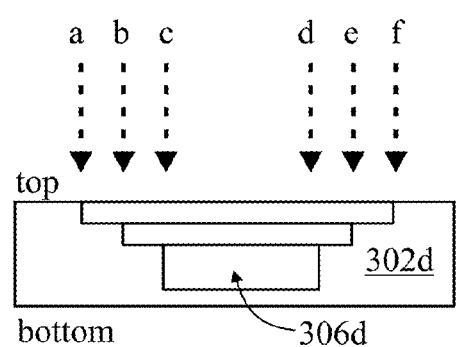
Figure 3C:
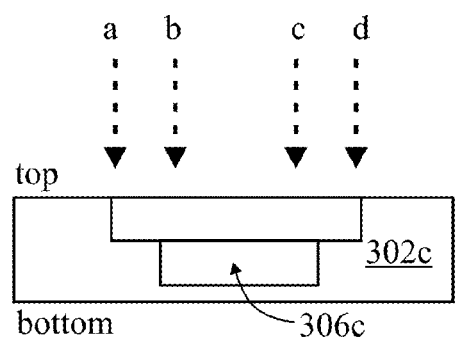

FIG. 3C is a cross-sectional view illustrating a technique for forming a recess in an inlay substrate using laser ablation, according to an embodiment of the invention.

FIG. 3D is a cross-sectional view illustrating a technique for forming a recess in an inlay substrate using laser ablation, according to an embodiment of the invention.

Figure 4:
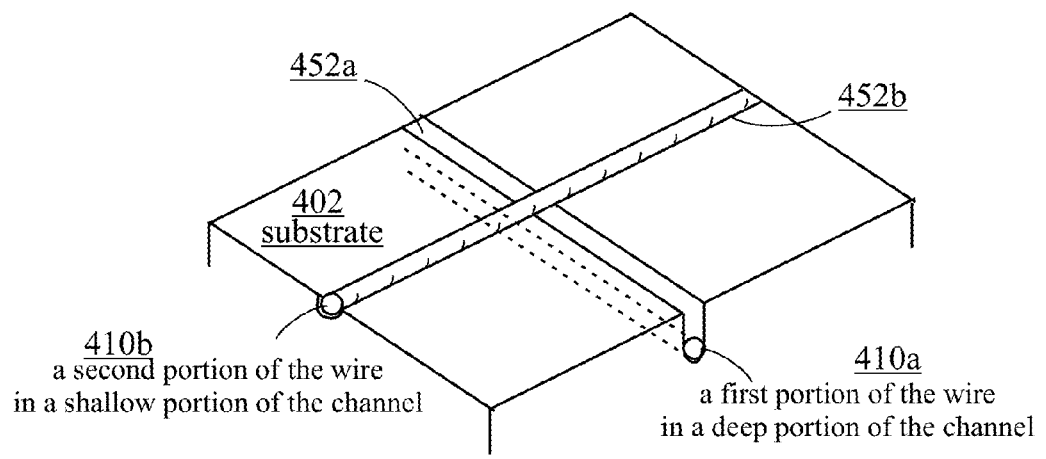

FIG. 4 is a perspective view illustrating a technique for forming channels for mounting an antenna wire in an inlay substrate, according to an embodiment of the invention.

Figure 5:
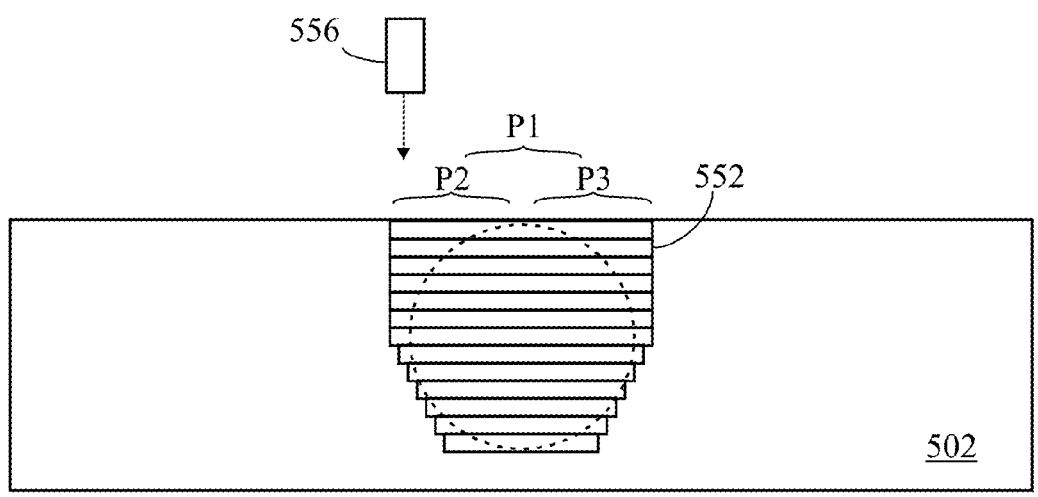

FIG. 5 is a cross-sectional view of a technique for forming channels for mounting an antenna wire in an inlay substrate, according to an embodiment of the invention.

Figure 6A:
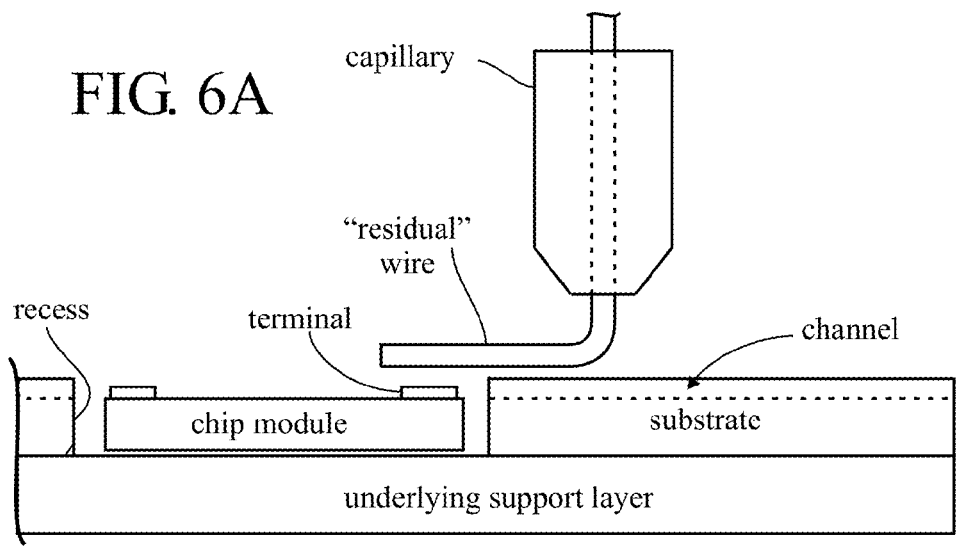

FIG. 6A is a cross-sectional view of a technique for mounting and connecting an antenna wire to a chip module of a transponder, according to an embodiment of the invention.

Figure 6B:
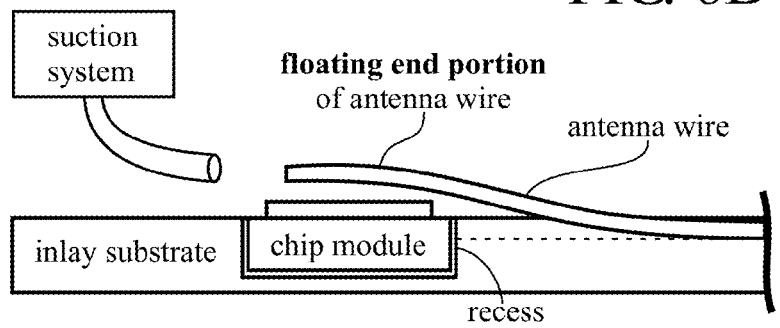

FIG. 6B is a cross-sectional view of a technique for mounting and connecting an antenna wire to a chip module of a transponder, according to an embodiment of the invention.

Figure 6C:
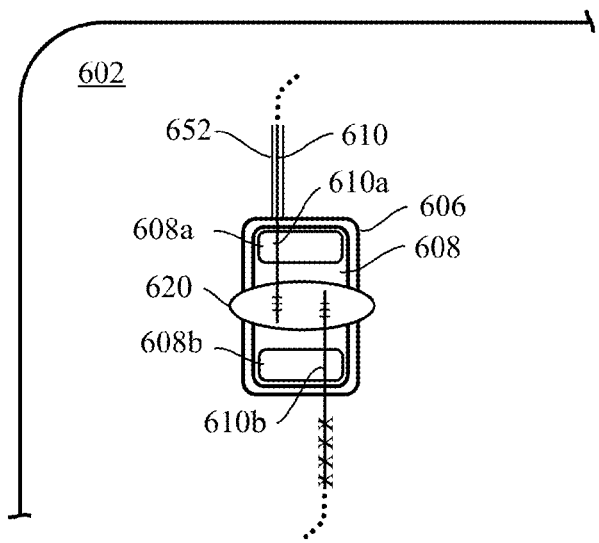

FIG. 6C is a cross-sectional view of a technique for mounting and connecting an antenna wire to a chip module of a transponder, according to an embodiment of the invention.

Figure 7A:
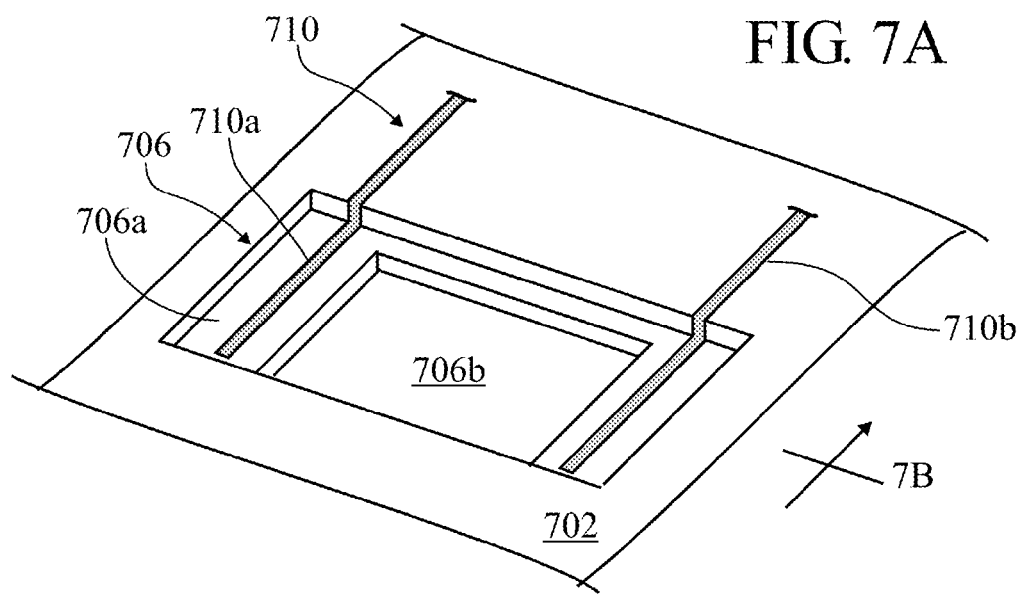

FIG. 7A is a perspective view of a technique for mounting and connecting an antenna wire to a chip module of a transponder, according to an embodiment of the invention.

Figure 7B:
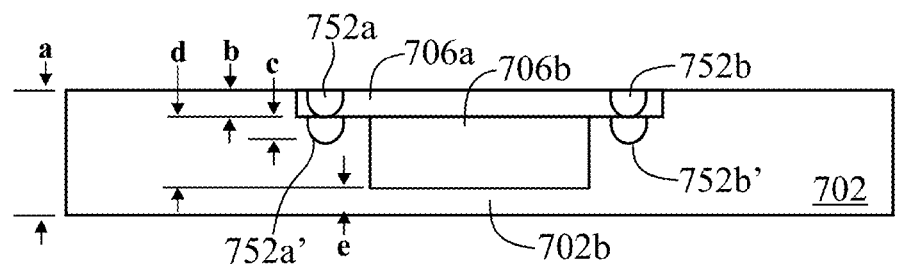

FIG. 7B is a cross-sectional view taken on a line 7B-7B through FIG. 7A.

Figure 7C:
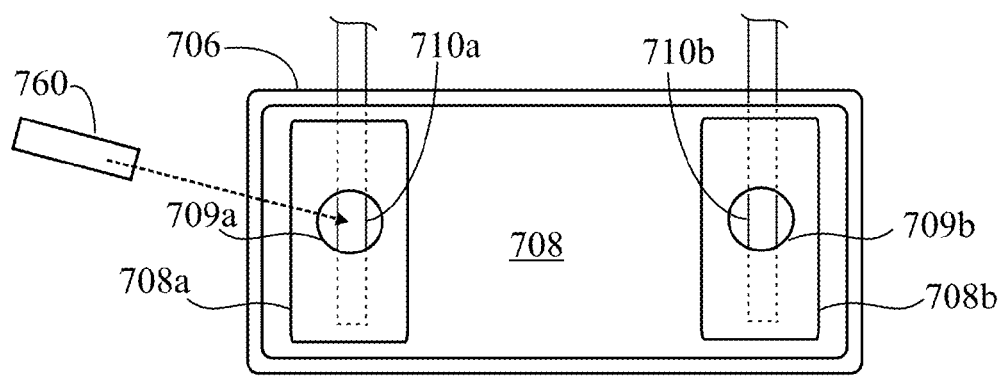

FIG. 7C is a top view of a further step in the technique of FIG. 7A.

Figure 8:
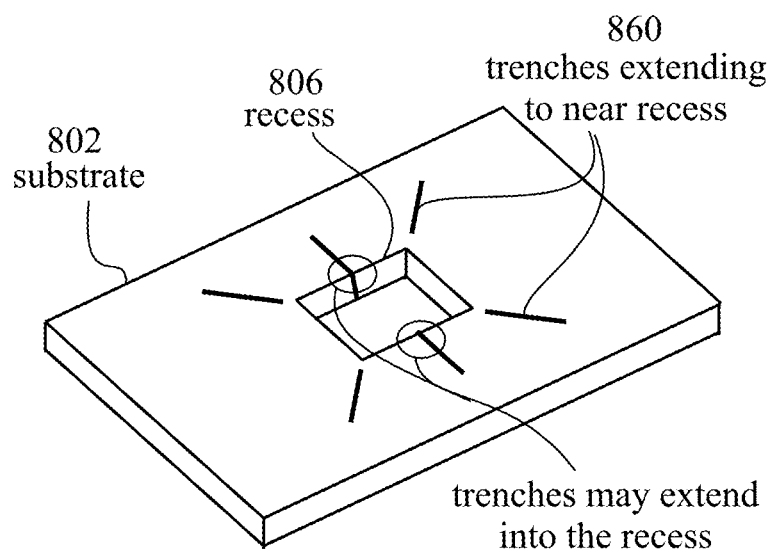

FIG. 8 is a perspective view of forming trenches around a recess in a substrate, according to an embodiment of the invention.

Figure 9A:
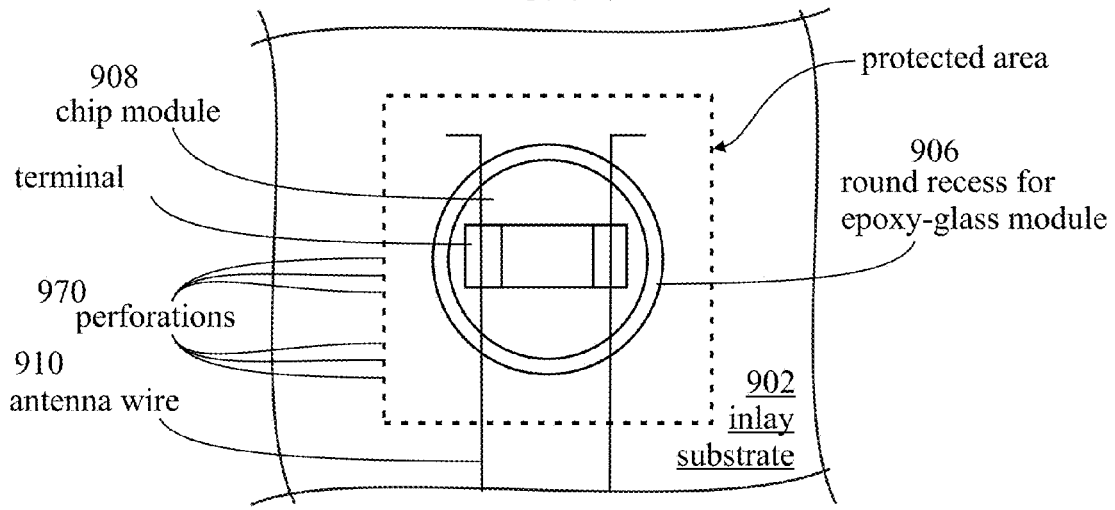
Figure 9B:
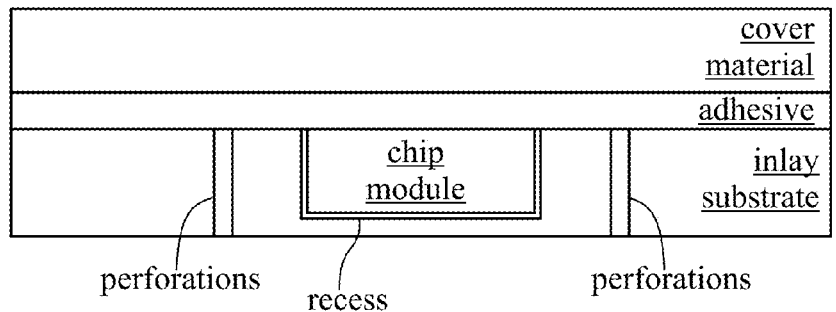
Figure 9C:
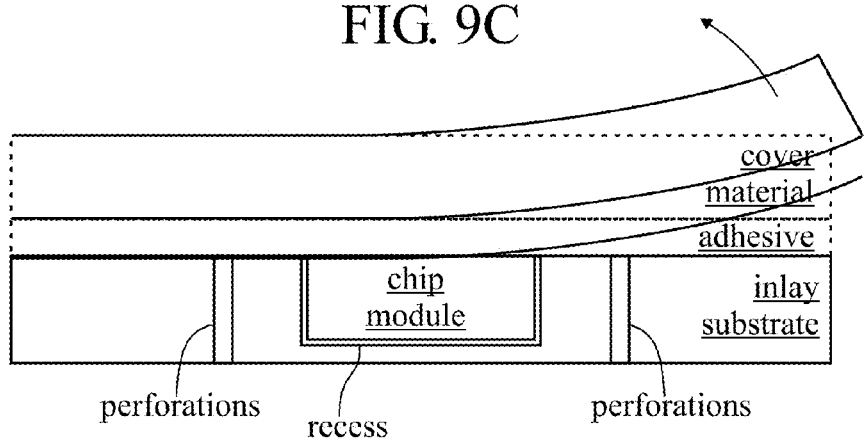

FIG. 9A is a top view, and FIGS. 9B and 9C are cross-sectional views of a technique for forming a protected area around a chip module in an inlay substrate, according to an embodiment of the invention.

Figure 10A:
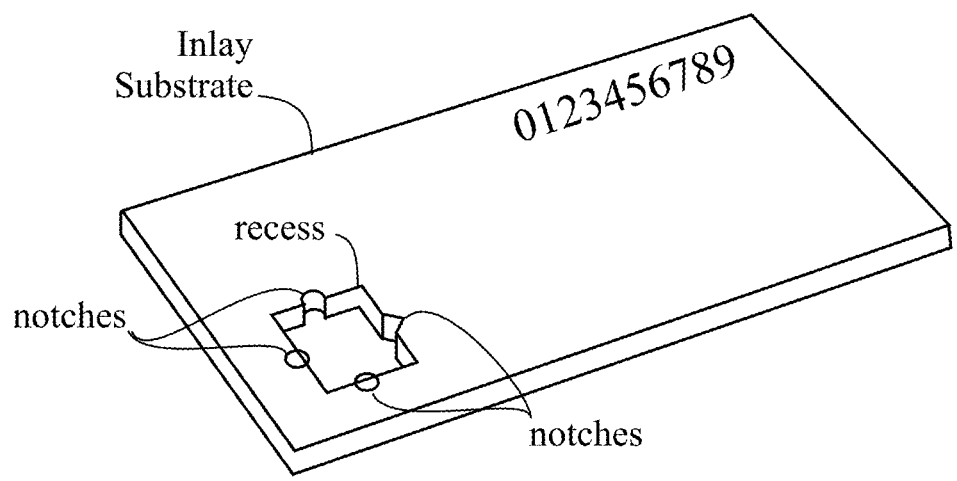
Figure 10B:
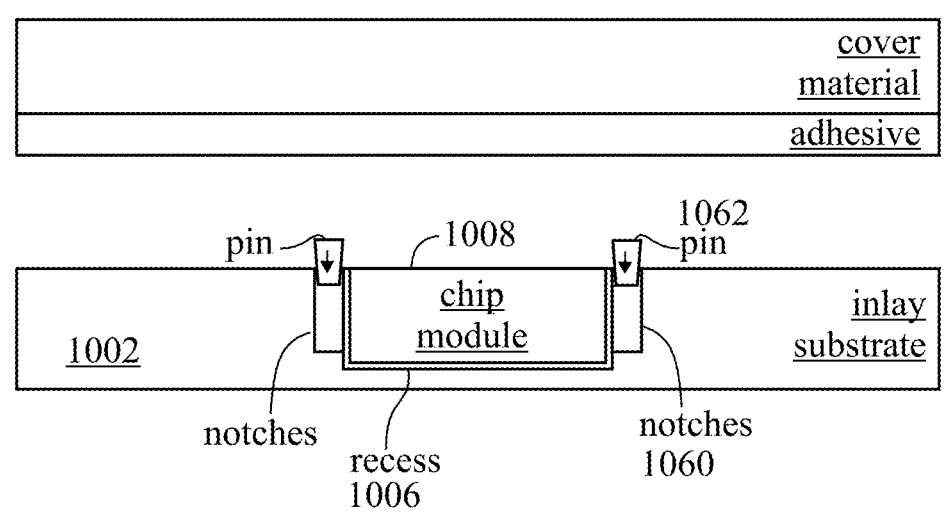

FIG. 10A is a perspective view, and FIG. 10B is a cross-sectional view of a technique for "pinning" a chip module in a recess in an inlay substrate, according to an embodiment of the invention.

Figure 11A:
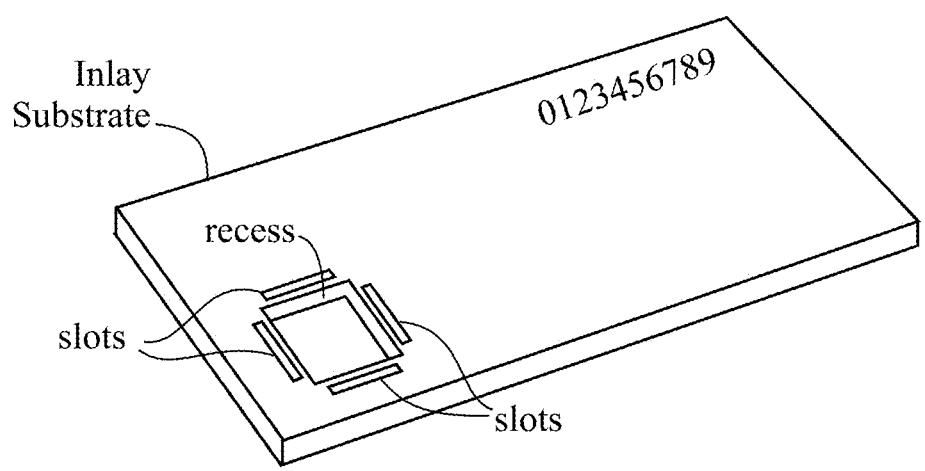
Figure 11B:
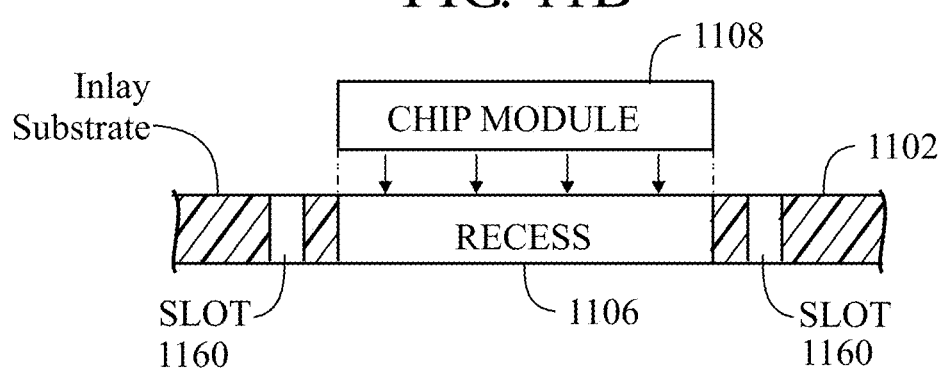

FIG. 11A is a perspective view, and FIG. 11B is a cross-sectional view of a technique for retaining a chip module in a recess in an inlay substrate, according to an embodiment of the invention.

Figure 12A:
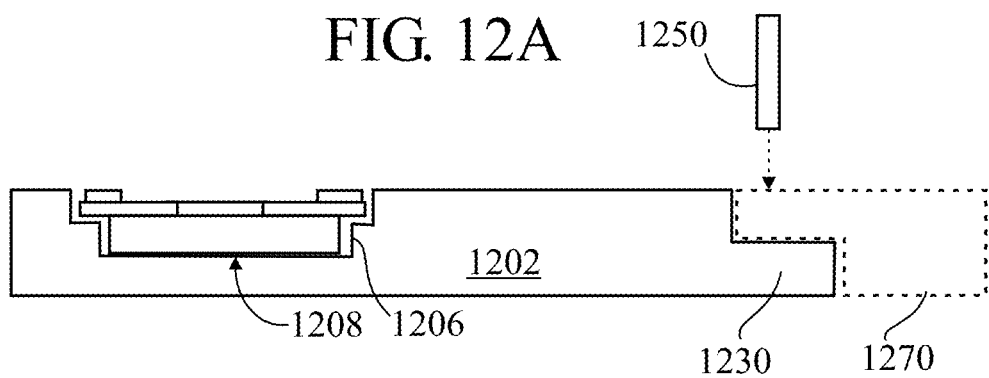

FIG. 12A is a cross-sectional view of a technique for modifying an edge portion (region) of an inlay substrate to mate with an other element such as a flap, according to an embodiment of the invention.

Figure 12B:
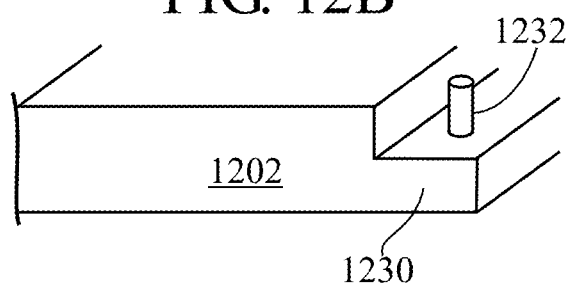
Figure 12C:
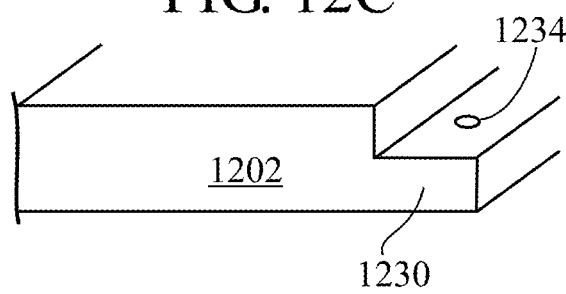

FIGS. 12B and 12C are partial perspective views of alternatives to the technique shown in FIG. 12A, according to embodiments of the invention.

DETAILED DISCLOSURE

Various "embodiments" of the invention (or inventions) will be discussed. An embodiment is an example or implementation of one or more aspects of the invention(s). Although various features of the invention(s) may be described in the context of a single embodiment, the features may also be provided separately or in any suitable combination. Conversely, although the invention(s) may be described herein in the context of separate embodiments for clarity, the invention(s) may also be implemented in a single embodiment.

The relationship(s) between different elements in the figures may be referred to by how they appear and are placed in the drawings, such as "top", "bottom", "left", "right", "above", "below", and the like. It should be understood that the phraseology and terminology employed herein is not to be construed as limiting, and is for descriptive purposes only.

The invention relates generally to inlays and techniques for making the inlays, including technical features and security features. As used herein, an "inlay" may be a single- or multi-layer substrate containing HF (high frequency) and/or UHF (ultra-high frequency) radio frequency identification (RFID, transponder) chips and/or modules. These inlays may be used in secure documents, such as, but not limited to, electronic passports (ePassports) and electronic ID (eID) cards.

In some of the figures presented herein, only one end or end portion of the antenna wire and a corresponding single one of the two terminals of the chip module may be shown as described, as exemplary of how both ends or end portions of the antenna wire may be mounted to the inlay substrate and connected by a connection portion of the antenna wire to the terminals of the chip module, unless as otherwise may be noted. A connection portion of the wire may be an end or end portion of the wire.

In some of the techniques for mounting and connecting an antenna wire presented herein, mainly the mounting of the antenna wire is described in detail. Typically, the connecting of the antenna wire will occur subsequent to mounting, using a conventional thermode-type tool in a conventional manner, and may only be briefly discussed and/or shown.

In the main, examples of electronic passport covers with inlay substrates having leadframe modules may be used to illustrate the embodiments. It should be understood that various embodiments of the invention(s) may also be applicable to other secure documents containing electronics (such as RFID and antenna), such as electronic ID cards. Secure documents may also be referred to as "electronic documents". In the main hereinafter, secure documents which are passport inlays, typically cold laminated (with adhesive), are discussed.

The following embodiments and aspects thereof may be described and illustrated in conjunction with systems, tools and methods which are meant to be exemplary and illustrative, not limiting in scope. Specific configurations and details may be set forth in order to provide an understanding of the invention. However, it should be apparent to one skilled in the art that the invention(s) may be practiced without some of the specific details being presented herein. Furthermore, well-known features may be omitted or simplified in order not to obscure the descriptions of the invention(s).

Forming Channels or Grooves to Accept the Antenna Wire

The conventional technique (such as in U.S. Pat. No. 6,233,818) for mounting the antenna wire is by ultrasonically embedding (countersinking) it into the surface of the inlay substrate. Ideally, the antenna wire is fully embedded so that it is flush or below the top surface of the inlay substrate. However, with ultrasonic embedding, the wire may become only partially embedded, such as approximately half its diameter. In other words, a 100 µm diameter wire may be embedded 50 µm (half its diameter) into the inlay substrate, and may protrude approximately 50 µm (half its diameter) from the surface of the inlay substrate. And, in the case of adhesively sticking, a 100 µm diameter wire may be substantially not embedded at all into the inlay substrate, and may protrude approximately 100 µm (its entire diameter) from the surface of the inlay substrate.

For applications such as driver's license or passports, it is generally not desirable that the wire extend (protrude) above the surface of the inlay substrate. As discussed hereinabove, the chip module may be recessed so as to be substantially contained within the inlay substrate (or sheet), without sticking out and creating a bump.

According to an embodiment of the invention, the antenna wire may be mounted so as to be substantially entirely disposed (embedded) within the surface of the inlay substrate, without protruding therefrom. In other words, the wire will be substantially entirely recessed below the surface of the inlay substrate.

Generally, this may be accomplished by creating a "groove" (or "channel", or "trench") in the surface of the inlay substrate to accept the antenna wire. Then, the antenna wire may then be laid (inlaid, pressed, sunk) into the groove.

In general, the groove may be formed either by removing material from the substrate (by analogy, digging a trench with a shovel, and tossing the dirt aside), or displacing material of the substrate (by analogy, hoeing a trench to push aside dirt). Some exemplary techniques for removing or displacing material will be described below. A mechanical tool, such as a wire bonder, may be used to form and press the wire into the groove.

The depth of the groove should be at least a substantial portion of the diameter of the wire, such as at least 50% of the diameter of the wire, including at least 60%, at least 70%, at least 80% and at least 90%, and the groove may be at least as deep as the wire diameter, such as at least 100%, at least 105%, at least 110%. In some cases, described below, the groove may be a "deep trench" which is much greater than the diameter of the wire, for routing the wire from one level, such as just within the surface of the substrate) to another level, such as deep within the substrate, such as for facilitating connecting the wire to contact areas or pads of a module which are disposed below the surface of the substrate (see, for example, FIGS. 2B and 2D where the wire ends are bonded to a bottom surface of the leadframe, rather than to the top surface thereof).

For example, for mounting a 60 µm diameter wire, a groove which is approximately 60 µm deep may be formed into the surface of the inlay substrate. As discussed below, in conjunction with mechanically embedding the antenna wire in the groove, heat may be applied to allow further embedding. Therefore, for example, a 60 µm wire could be pressed, with heat, into a 40 µm deep groove, and become substantially entirely embedded within the surface of the substrate, without protruding therefrom.

The groove may be less deep than the diameter of the wire and, as the wire is laid down into the groove, it may be pressed further into the substrate. Or, after the entire antenna wire is laid down, the inlay substrate may be placed in a press which may further sink the antenna wire into the inlay substrate. The process may be performed in a warm environment to soften the substrate. The wire may be warmed as it is being laid down (scribed, sunk) into the trench (groove) to facilitate its entry into the trench.

The width of the groove may be approximately equal to the diameter of the wire. For example, for a wire having a diameter of 60-80 µm, a laser beam having a diameter of 0.1 mm (100 µm) would create a groove sufficiently wide (100 µm) to receive the wire. The groove may be narrower than the diameter of the wire, such as approximately 95% of the diameter of the wire, to facilitate an "interference" fit, securely holding the wire in position for subsequent handling. In general, a groove which is significantly wider than the diameter of the wire would not be preferred, since it would tend not to retain the wire (such as by interference fit), without more (such as an adhesive).

The groove may be slightly narrower than the diameter of the wire, and as the wire is being laid down, the material of the inlay substrate may resiliently retract (e.g., elastic deformation) to receive the wire, holding it in place. Generally, the wire typically has a circular cross-section (but may have other cross-sections, such as a ribbon wire), and the groove may have a substantially rectangular cross-section. For example, a 60 μm wide groove may receive and retain in place an 80 μm diameter wire. The wire may be warmed as it is being laid down (scribed, sunk) into the groove to facilitate its entry into the groove.

The groove may simply be a channel extending along the surface of the inlay substrate, formed by a mechanical tool (ultrasonic stamp or scribe), or by a hot mold process. Alternatively, the groove may be formed by laser ablation, in a manner similar to how recesses are made.

Generally, the groove facilitates holding the wire in place. For example, a 100 micron diameter wire can be inserted (with some pressure) into a narrower, such as 95 micron wide channel (the depth of the channel should be at least half the diameter of the wire, so that the wire can be embedded "over center"), and will stay in place. It is beneficial that this can be done without requiring an ultrasonic embedding tool. As mentioned above, mounting a wire to the inlay substrate is typically done by ultrasonically embedding the wire into the inlay substrate, or ultrasonically causing a self-bonding wire to adhere to the inlay substrate. The "channeling technique" disclosed herein can proceed faster than the ultrasonic techniques, and sheets can be prepared with wire channels, off-line, then the wire can be installed in a simple embedding machine which does not need ultrasonics.

According to an embodiment of the invention, channels (or grooves, or trenches) are formed in the substrate for receiving the antenna wire, and the antenna wire is installed (laid) into the channel, which has several advantages, such as eliminating the need for the pressing operation associated with ultrasonic embedding of the antenna wire. Various techniques for forming the channels will briefly be described.

FIG. 2A (illustrates a technique 200a using a laser 250 to form a groove (channel, trench) 252a in a surface of an inlay substrate 202. This is an example of removing material to form the groove. The laser 250 is shown moving from left-to-right in the figure. Laser ablation of material to form channels (grooves, trenches) will be described in greater detail hereinbelow.

A wire 210 is shown being laid down into the groove 252a, from left-to-right, and may be urged into the groove 252a by a simple pressing tool (or wheel) 254. The wire 210 may be laid into the groove 252a during formation of the groove (channel), by following after the laser a distance "u".

Although only one straight groove is shown, a 2-dimensional (x-y) groove pattern may thus be formed in the top surface of the inlay substrate, extending from (originating and terminating at) a recess in the inlay substrate, for accepting an antenna wire having a number of turns or coils. As mentioned above, insulated wire is relevant where the wire needs to cross over itself, such as in FIG. 1A. Methods of forming a single groove with multiple passes of the laser, and forming grooves with tapered (profiled) sidewalls are described below.

The wire may be a self-bonding (coated, self-adhering wire). In conjunction (such as simultaneous with) laying the wire in the groove (channel), the wire 210 may be warmed thermally (such as with heat), chemically activated (such as with alcohol), or warmed electrically (such as by passing a current through the wire. The pressing tool 254 itself may be heated. Or, a separate heating element 256 may be provided, such as a nozzle directing hot air onto the wire either immediately before (to the right of) or after (to the left of, as shown) the pressing tool 254. The heating element 256 may be a laser operating in a range to heat the wire sufficiently to activate the adhesive coating.

FIG. 2B illustrates a technique 200b using a mechanical tool 260b to form a groove 252b in a surface of an inlay substrate 202. This is an example of removing material to form the groove. The tool may be a milling tool, such as a conventional or climb milling tool available from IBAG Switzerland AG, described hereinabove. Reducing the temperature of the material being milled, as discussed above, may be employed.

Alternatively, the tool 250b may be similar to a "gouge" used to carve patterns in wood. (Gouge—Carving tool with a curved cutting edge.) A gouging tool 250b is shown moving from left-to-right in the figure. In this figure, the wire (202) and the pressing tool (254) are omitted, for illustrative clarity. The "debris" from gouging (or milling) is also omitted, for illustrative clarity.

In either of using laser ablation or a mechanical tool to form the channels, the process is one of removing material, and may be performed at reduced temperature, such as by chilling (freezing) the inlay substrate (polymer) with a stream of cold gas, such as freeze gas (or spray) at approximately −50° C. (resulting in the substrate being chilled to approximately −20° C.). A suitable freeze spray is Kontakt Chemi 75 (CRC Industries).

FIG. 2C illustrates a technique 1200c using an ultrasonic stamp tool 250c form a groove 252c in a surface of an inlay substrate 202. This is an example of displacing material, with pressure, to form the groove. The tool may be a thin rectangular block, or a small diameter cylinder, mounted to an ultrasonic converter (not shown). The tool 250c is shown moving from left-to-right in the figure. In this figure, the wire (202) and the pressing tool (254) are omitted, for illustrative clarity. A similar tool could be used to push the wire further into the substrate, once it has already been (partially) embedded therein.

FIG. 2D illustrates a technique 200d forming a groove 252d in the surface of an inlay substrate 202 by using heat and molding. Essentially, a die tool 250d having a raised pattern 251 corresponding to the desired pattern for the groove(s) is pressed (arrow) down against the surface of the inlay substrate 202, and heat may be applied, to transfer the pattern to (mold the pattern into) the inlay substrate. This technique can also be considered to be "displacing".

Regarding techniques for displacing material to form a channel for the antenna wire, it could be said that in straight-forward embedding (ultrasonic, sonotrode), the wire displaces substrate material as it is embedded into the surface of the substrate. It should be understood that the displacing techniques described herein are performed with a tool separate and distinct from the wire, and prior to the wire being embedded in the surface of the substrate.

It should be understood that the channels for antenna wire being discussed herein are "pre-formed" (prior to mounting/embedding the antenna wire therein) in a desired pattern for the antenna. An inlay substrate may be prepared with such pre-formed channels for later embedding of antenna wire.

The channel to accept a wire does not have to be laser ablated, it can be formed through direct etching (lithographic process), x-ray (using a mask), chemically, mechanically or thermally (electromagnetic radiation). Or it could be a transfer process using an additional layer of material, such as adhesive, in which channels are formed prior to the additional layer of material being placed on the inlay substrate or after it is placed on the substrate.

FIG. 2E shows embedding a wire in the channel. This can be done during channel formation, such as indicated in FIG. 2A, with the wire following close behind the laser, or the wire can be installed in a separate step after the entire channel is formed. In this example, a groove 252e (compare any of grooves 262a, 262b, 262c, 262d) is formed in the substrate 202, and a wire 210 installed (inserted, mounted, laid into) in the groove using any suitable mechanical tool 254.

The wire conductor used to countersink in the laser ablated (or otherwise formed) trench or channel in the substrate may be a self-bonding wire with a coating of polyurethane adhesive as an outer layer and an insulated layer as the inner core surrounding the metal wire such as copper. During the countersinking process of placing the wire conductor into the trench or channel, a laser may be used to soften or melt (or activate) the outer layer of the wire in order to bond the self-bonding wire to the walls of the trench or channel.

It should be understood that when a wire is installed into a pre-formed groove, this is different than ultrasonic embedding of a wire into a non-grooved surface of a substrate, such as is disclosed in U.S. Pat. No. 6,698,089 (or U.S. Pat. No. 6,233,818). The tool 254 for installing the wire into the groove 252e may or may not be ultrasonic.

After installing, the wire may protrude slightly above the top surface of the substrate 202. If sufficient pressure, heat and/or ultrasonic are used during installing the wire and/or the groove is sufficiently deep, the wire may be fully embedded, flush with the top surface of the substrate.

It should be understood that the channel to accept the wire does not have to be laser-ablated, rather it can be formed using other techniques such as gouging, ultrasonic stamp and heat mold, as described above, as well as by using
  direct etching (lithographic process),
  x-ray (using a mask),
  chemically,
  mechanically or thermally.

It is within the scope of the invention that channels for accepting antenna wire may be formed in a layer or film of material which is separate from the substrate, such as
  forming channels in a layer of adhesive on the surface of the substrate, or
  forming channels in a film of material, then applying the film to the substrate Laser Ablation of Polymers Laser ablation may be used to remove material from a substrate or film, typically of a synthetic material, typically of an inlay substrate of a secure document, such as for
  (i) creating a recess (cavity, pocket) to accommodate a chip or chip module and/or
  (ii) forming channels (or grooves or trenches or notches) in the substrate (or layer or film) to accept a wire conductor which may serve as the antenna of a transponder incorporated into the secure document The controlled removal of substrate material by intense light is called laser ablation, derived from the Latin word ablatum, or sometimes also referred to as Ablative Photo Decomposition (APD). The material removal occurs only if a certain threshold in light intensity is exceeded.

Laser ablation is the process of removing material from a solid (or occasionally liquid) surface by irradiating it with a laser beam. At low laser flux, the material is heated by the absorbed laser energy and evaporates or sublimates. At high laser flux, the material is typically converted to a plasma. Usually, laser ablation refers to removing material with a pulsed laser, but it is possible to ablate material with a continuous wave laser beam if the laser intensity is high enough.

The depth over which the laser energy is absorbed, and thus the amount of material removed by a single laser pulse, depends on the material's optical properties and the laser wavelength. Laser pulses can vary over a very wide range of duration (milliseconds to femtoseconds) and fluxes, and can be precisely controlled. This makes laser ablation very valuable for both research and industrial applications.

The simplest application of laser ablation is to remove material from a solid surface in a controlled fashion. Laser machining and particularly laser drilling are examples; pulsed lasers can drill extremely small, deep holes through very hard materials. Very short laser pulses remove material so quickly that the surrounding material absorbs very little heat, so laser drilling can be done on delicate or heat-sensitive materials.

A typical laser for ablating synthetic material such as Teslin™ or polycarbonate is an ultra violet diode pump laser operating at the wavelength of 355 nm.

Laser ablation may be used for the machining of cavities in commercial polymers (ultra high molecular weight polyethylene and polycarbonate) to accept an electronic component such as a microchip (or chip module). Heretofore, UV laser ablation of commercial polymers in industrial applications have had limited commercial success because of high ablation thresholds, low ablation rates resulting in low production throughput and re-deposition of debris.

Laser ablation of polymers can be performed under atmospheric conditions and at room temperature, making it a very attractive alternative to traditional micromachining of 3 dimensional structures using high speed mechanical milling.

Thermoplastic polymers (compound with a molecular structure) have a low thermal conductivity and extremely high UV absorption and so direct bond breaking without heat is possible using lasers emitting in the UV range 157-355 nm. This process is called cold ablation and for the ablation of most polymers, nanosecond UV lasers are well suited.

The nature of the interaction mechanisms between the laser beam and the polymer substrate depend on the parameters of the laser light energy and on the physical (microstructure) and chemical properties (the arrangement of atoms or molecules within a polymer) of the substrate.

The successive phases in the irradiation of a polymer substrate with intense nanosecond UV-pulses can be described roughly in the following diagrams:

A laser beam may be focused on a substrate to cause ablation. Ablation may be broken down into the following three phases
  (a) interaction of the laser beam with the target substrate with UV light absorption and generation of electronic excitation
  (b) high pressure generated by bond breakage of the target substrate.
  (c) removal or sputtering of the ablated material from the target substrate.

The first phase of the laser ablation process begins with the absorption of photons at UV wavelengths in the substrate and this leads to electronic and vibrational excitation of the molecules.

In a second phase, the electronic excitation relaxes and a conversion decomposition mechanism takes place via heat generation (photothermal activation), photochemical and photomechanical reaction. This mechanism induces bond breaking, evaporation and desorption. However, the exact pathways leading to decomposition are unclear and controversial. See Bauerle, D. (2000). Laser Processing and Chemistry, third ed. Advanced Texts in Physics. Berlin, Heidelberg, N.Y.: Springer-Verlag, incorporated by reference herein.

In a third phase, mainly gaseous components (a multiple of the original solid) will be forcefully ejected from the surface at high pressure, causing the removal of material. The components travel with speed and are preceded by a shockwave front due to compression of the ambient atmosphere.

The ejected plume consists of vapor, driving gas and particles of which some will be re-deposited as debris around the ablation crater. (The word crater is used in laser science to describe the process of ablation (explosive), the resulting area is a recess when machined properly at the right wavelength, pulse duration and fluence. A crater may be a recess, or a channel, or any feature formed by laser ablation.)

The deposition of debris can be minimized by directing a medium such as He or H2 to the ablation area at low pressure. These gases allow the plume to expand much faster preventing less particle formation and re-deposition.

Apart from the substrate material, the most important laser parameters affecting the ablation mechanism are:
Wavelength ($\lambda$) of the laser emission and the ability of the polymer substrate to absorb that wavelength
Pulse energy (E)
Intensity or irradiation fluence ($\Phi$) of the laser beam delivery
Pulse duration (t)
Frequency of the pulses (usually referred to as the repetition rate) (Q)
Angle of incidence
Beam shape and quality
Dwell time (irradiation time at a particular spot)
But, these parameters are further influenced by other factors such as multiphoton absorption, thermal diffusion, scattering due to surface roughness, and various hydro dynamical processes.

It is a general object of the invention to structure polymer materials for hosting RFID chips (or chip modules) in manufacturing an intermediate product known as an inlay used by secure printers in the production of electronic passports and national identity cards. In particular, to machine a microporous polymer substrate (such as Teslin) with a target ablation rate of up to approximately 5 mm$^3$/second, creating a stepped recess or a pocket-type recess which extends only partially through a substrate. This recess or pocket is prepared to accept a leadframe RFID chip module such as an MOB 6 from the semiconductor company NXP. (The polymer material may also be non-porous.)

According to an aspect of the invention, faster ablation may be achieved by amalgamating several techniques to create a hybrid ablation process.

In the main hereinafter, forming channels in polymer substrates using laser ablation will be discussed.

A suitable tool for performing the laser ablation techniques described herein is the TruMicro Series 5000 laser by TRUMPF Laser GmbH+co. KG (Schramberg Germany).

An advantage of the techniques disclosed herein for forming a channel (or channels) for the wire include that there is substantially no displacement of substrate material (of course, with an "interference fit", some displacement of the substrate material is desirable, as the walls of the groove may expand resiliently when inserting the wire.) Also, un-insulated wire may be used, which has the advantage that insulation need not be removed from connection portions of the wire prior to bonding to the terminals of the chip module.

To assist the ablation process of the polymer in creating craters, trenches or channels, the ablation zone of the substrate material can be heated or frozen (e.g. using freeze gas) prior to the material being removed. Alternatively, the material can be treated with carbon by passing the polymer through a laser printer to induce (lay down a specific pattern or broader blanket of) black toner into the area to be machined. Alternatively, black ink can be applied to the substrate material prior to ablation. Carbon may have the beneficial effect of lowering the ablation threshold and increasing the absorption of the laser energy at the ablation zone. Reference is made to U.S. Pat. No. 4,693,778, incorporated by reference herein.

Forming Recesses by Laser Ablation

FIGS. 3A-3D illustrate various techniques for using a laser to ablate material in a controlled manner from a substrate such as an inlay substrate to form a recess extending into a surface of the inlay substrate.

FIG. 3A shows forming a recess (opening, window) in a single layer of material, such as a layer of Teslin™ for an inlay substrate, using laser ablation. This single layer of material may also be representative of each of the two layers in a multi-layer inlay substrate such as are shown in FIGS. 2A and 2B. (See also FIG. 8 of "S16") As described therein FIG. 8 ("S16") illustrates an exemplary process 800 of forming a recess 806 in a substrate 802, using a laser 860. The substrate 802 may be a single layer of Teslin (for example), having a thickness "t" of 355 μm in the z-direction, and measuring 183 mm×405 mm (3up format) in the x- and y-directions. A typical size for the recess 806, to accommodate a chip with lead frame, may be approximately 5 mm×8 mm, by 260 μm deep.

The laser 860 emits a beam (dashed line), targeted at the substrate 802, to ablate material from the substrate 802 to form the recess 806. The beam may have a diameter of approximately 0.1 mm. The beam may be scanned back and forth, traversing in one direction entirely across the recess area, turning around, and traversing back across the recess area, like plowing a field. Many passes may be required to carve out the entire area of the recess, given that the beam diameter is typically much (such as 10-100 times) smaller than the length or width of the recess. As is known, the beam may be scanned, in any suitable manner, such as with mirrors. Also, the intensity of the beam may be controlled or modulated to control the penetration into the substrate. For example, a pulse-width modulated beam may be used. The laser may be a UV laser (355 nm) with a power ranging from 20 to 70 watts.

The process of using a laser in this manner, rather than (for example) a conventional rotating milling tool, may be referred to as "laser milling". The technique described herein may be particularly beneficial for applications where it is desired to form a "pocket" type recess which intentionally does not extend all the way through the substrate or sheet (in other words, the recess or pocket extends only partially through the substrate). Mechanical milling can be difficult. On the other hand, laser milling can be very effective for Teslin and polycarbonate substrates. For PVC, laser milling is less effective.

FIG. 3A illustrates an exemplary process 300 of forming a recess 306 in an inlay substrate 302, using a laser 360. The inlay substrate 302 may be a single layer of Teslin (for example), having a thickness "t" of 355 μm. A typical size (width dimensions) for the recess 306, to accommodate a chip module (such as 210) with a lead frame (such as 218), may be approximately 5 mm×8 mm. The recess 306 may extend completely through the inlay substrate 302, resulting in a window-type recess. The recess 306 may extend only partially, such as 260 μm through the inlay substrate 302, resulting in a pocket-type recess.

The laser 360 emits a beam (dashed line), targeted at the substrate 302, to ablate material from the substrate 302 to form the recess 306. The beam may have a diameter of approximately 0.1 mm. The beam may be scanned back and forth, traversing in one direction entirely across the recess area, turning around, and traversing back across the recess area, like plowing a field. Many passes may be required to carve out the entire area of the recess, given that the beam diameter is typically much (such as 10-100 times) smaller than the length or width of the recess. As is known, the beam may be scanned, in any suitable manner, such as with mirrors. Also, the intensity of the beam may be controlled or modulated to control the penetration into the substrate. For example, a pulse-width modulated beam may be used. The laser may be a UV laser (355 nm) with a power ranging from 20 to 70 watts.

The process of using a laser in this manner, rather than (for example) a conventional rotating milling tool, may be referred to as "laser milling". The technique described herein may be particularly beneficial for applications where it is desired to form a "pocket" type recess which intentionally does not extend all the way through the substrate or sheet (in other words, the recess or pocket extends only partially through the substrate). Mechanical milling can be difficult. On the other hand, laser milling can be very effective for Teslin and polycarbonate substrates. For PVC, laser milling is less effective.

The recess (opening) 306 formed in the inlay substrate 302 of FIG. 3A extends completely through the inlay substrate 302. The substrate 302 may be a one layer of a multi-layer substrate.

FIG. 3B shows forming a stepped window-type recess 306b in a single layer of material, such a layer of Teslin™ for an inlay substrate 302b, using laser ablation. This may be a two-step process comprising:
 first laser milling a central area (such as between "b" and "c") to a first partially through the substrate,
 then continuing laser milling the entire area (such as between "a" and "c") to create a recess extending partially through the substrate in a peripheral area, and to extend the recess in the central area completely through the substrate.
Alternatively:
 first laser milling the entire area (between "a" and "d") to a first depth (d1)
 then laser milling only the central area (between "b" and "c") to a second depth (d2).

FIG. 3C shows forming a stepped pocket-type recess 306c in a single layer of material, such a layer of Teslin™ for an inlay substrate 302c, using laser ablation. This may be a two-step process comprising:
 first laser milling a central area (such as between "b" and "c") to a depth partially through the substrate,
 then continuing laser milling the entire area (such as between "a" and "d") to create a recess extending partially through the substrate in a peripheral area, and to extend the recess in the central area deeper into (but not completely through) the substrate.
Alternatively:
 first laser milling the entire area (between "a" and "d") to a first depth (d1)
 then laser milling the central area (between "b" and "c") to a second depth (d2).

FIG. 3D shows that a two-step pocket type recess 306d can be formed in a single layer of material, such a layer of Teslin™ for an inlay substrate 302c, using laser ablation. This may be a three-step process comprising:
 first laser milling a central area (such as between "c" and "d") to a depth partially through the substrate,
 next laser milling a middle area (such as between "b" and "e") to a depth partially through the substrate, which will increase the depth in the central area,
 then continuing laser milling the entire area (such as between "a" and "f") to create a recess extending partially through the substrate in a peripheral area, and to extend the recess in the middle and central area deeper into (but not completely through) the substrate.
Alternatively:
 first laser milling the entire area (between "a" and "f") to a first depth (d1)
 then laser milling the middle area (between "b" and "e") to a second depth (d2)
 then laser milling the central area (between "c" and "d") to a third depth (d3).
For example, the resulting depths may be:
 in the peripheral area ("a"-"b", "e"-"f"), approximately 0.056 mm
 in the middle area ("b"-"c", "d"-"e"), approximately 0.116 mm
 in the central area ("c"-"d"), approximately 0.306 mm
 remaining thickness at the bottom of the central area, approximately 0.050 mm
 (total thickness of the substrate, 0.306+0.050=0.356)

Accommodating Crossing Wires

In some cases, depending on the pattern of the antenna, it may be necessary for the antenna wire to cross itself. For example, see compare FIG. 4 of U.S. Pat. No. 6,088,230 and FIG. 5 of U.S. Pat. No. 6,233,818. FIG. 1A also shows an antenna pattern which has a crossover. Typically, a short circuit is avoided because the wire is insulated (and the sonotrode may be switched off in the vicinity of the crossover).

The use of channels can be advantageous for mounting an antenna wire in a pattern that requires the antenna wire to cross over itself, without shorting. For example:
 a first portion of the antenna wire may be "fully" embedded in a channel, without protruding above the surface of the substrate. The channel may be made deeper than the wire at the point where crossover will occur to ensure that the antenna wire is indeed fully embedded.
 Then, a second portion of the antenna wire which crosses over the first portion may be laid on the surface of the substrate.
Alternatively,
 a first portion of the antenna wire is fully embedded in a channel (or portion of the overall channel) which is very deep where the second portion will be crossing over
 the second portion of the antenna wire is embedded in a channel (or portion of the overall channel) which is "normal" depth for accepting a wire conductor
 The depth of the first channel portion is sufficient that the second portion of the wire crossing over the first portion of the antenna wire does not short thereto.

FIG. 4 illustrates the latter variation where there is a shallow channel 452a crossing over a deep channel 452b. The channels 452a and 452b may be portions of a single overall channel in the substrate 402.

A first portion 410a of the antenna wire 410 is disposed in the deep portion 452b of the channel, and is shown in dashed lines. A second portion 410b of the antenna wire is disposed in the shallow portion 452a of the channel. In this manner, the second portion of the antenna wire may pass over the first portion of the antenna wire without contacting it. Some exemplary dimensions are:

the wire may have a diameter of 80 μm
the channel(s) may have a width of 100 μm
the shallow channel may have a depth of 100 μm
the deep channel may have a depth of 200 μm
the substrate may have a thickness of 350 μm Generally, insulated and/or self-sticking (self-bonding) wire would be used. But using these techniques, un-insulated (bare) wire may also be used, again avoiding the necessity of removing insulation from connection portions of the wire.

Once the channel is created, the wire conductor (which may be a self-bonding wire) can be installed into the channel and simultaneously thermally or chemically activated (with laser, hot air, with alcohol), so that the adhesive layer of the self-bonding wire sticks to the walls of the channel.

Forming the Channels and Laying the Wire(s) into the Channel(s)

Techniques for forming channels in the inlay substrate and subsequently (including during forming the channels) laying (or routing) the wire in the channels have been described hereinabove. The inlay substrate may, for example, be a synthetic material such as Teslin™ or PC (polycarbonate).

In U.S. Pat. No. 6,233,818 the wire is embedded on (or in) the surface of the inlay substrate using ultrasonic energy (and a sonotrode). This can be problematic when using materials such as Teslin™ for the inlay substrate. Filler material in the Teslin™ inhibits the wire from embedding well. In such cases, the wire can only be embedded onto (and only slightly into) the surface of the substrate. A wire which is not fully embedded in the substrate results in an uneven topology, and with a thin cover material the antenna will be evident. Hence, in a subsequent step the wire is pressed with a laminator (heat and pressure) further into the surface of the substrate. This lamination step may also adversely affect the chip module. This issue of "hiding" the wire may be more problematic on passports where the cover material is relative soft and thin, in contrast with smart cards where there may be several layers of harder and thicker cover material.

According to an embodiment or aspect of the invention, it may be simpler and more efficient to lay the wire in preformed channels. The term "inlaying" may be used to describe this process, to distinguish it from any ultrasonic form of embedding. Other suitable terms may be "scribing", "inserting", "laying", "putting", "routing", and the like (as well as grammatical variations thereof). Generally, if ultrasonics are not required to mount the antenna wire to the inlay substrate, a sonotrode is not required.

The channel for receiving an antenna wire may be substantially the same width and depth as the diameter (for a non-round wire, a relevant width dimension) of the antenna wire, typically in the range of 30-112 μm. The channel may be slightly narrower than the wire, to receive the wire with an interference fit. The channel may be wider than the antenna wire.

The channel for receiving an antenna wire may be at least as deep as the diameter (for a non-round wire, a relevant depth dimension) of the wire, so that the wire is completely submerged in the channel. The channel may be shallower than the diameter of the wire, and a protruding wire may be left to protrude, or subsequently pressed into the substrate so as to be completely submerged. The channel may be deeper than the antenna wire to ensure that the antenna wire becomes completely submerged in the channel.

The channel may be formed using laser scanning ablation. Scanning means that the laser beam traverses the inlay substrate in at least one direction. For example, after making one pass (or row), the laser may be moved to the side for a subsequent pass in the same or opposite direction. (An analogy may be beam scanning in a Cathode Ray Tube television). Various parameters of the laser may be altered or adjusted for (or even during) each pass including wavelength, fluence, repetition rate, pulse width, beam shape, angle of incidence and dwell time.

If the diameter of the laser beam is sufficiently wide (corresponding with the desired width of the channel), and has sufficient fluence (to penetrate to the desired depth of the channel), the channel may be formed with one pass of the laser. To enhance the quality of the structures in a channel, it is advantageous to use an ultrafast laser (in the picosecond range) using a low fluence above the threshold fluence and removing material layer by layer (several passes). At high fluence, there is a trade-off in material removal and the quality of etching.

Or, multiple passes of the laser can be scanned across the length of the channel to increase the width and/or depth of the channel, each pass of the laser ablating the channel to an increased depth, in an iterative manner. For example, several passes of the laser may be used to form a channel having an overall depth of 80 μm by ablating a 30 μm wide, 5-10 μm deep amount of material with each pass. For example, to form a channel having a width of approximately 100 μm (such as 97 μm) and an overall depth of 80 μm, multiple passes of a laser having a beam width of 30 μm may be used. In one pass, the 30 μm diameter beam may ablate approximately a 70 μm wide area, to an average depth of approximately 5 μm. In subsequent passes, the beam may be overlapped with a previously ablated area, such as with a 50% overlap. In three or four passes, the 100 μm wide channel may be ablated.

Generally, the laser beam may be directed to the surface of a substrate via a galvanometer. The laser beam ablates the material line for line with an overlap of about 50-60% to get the best surface finish.

The width of the laser beam (hence, the resulting width of ablation) may be modified optically (beam shaping—such as with lenses, using a mask or changing the beam shape) to have a narrower laser beam width. The penetration of the laser beam (hence, the resulting depth of ablation) may be modified by changing the fluence and or repetition rate of the laser.

The channel may be formed with many (several) passes of the laser, each pass forming a portion of the overall channel. For example, a first pass of the laser may form a first portion of the channel having a width of approximately 100 μm (such as 97 μm) and a depth of 5 μm (dependent on the laser pulse energy and repetition rate). A second and several subsequent aligned passes of the laser may extend the previously formed portion(s) of the channel deeper, maintaining the same 97 μm width, until an intermediate channel depth of 45 or 50 μm is achieved—half of the desired overall depth of the channel. Then, maintaining alignment, in subsequent several passes the width of the laser beam may be lessened with each pass, resulting in a bottom portion (half) of the channel tapering down. In this manner, a channel can be created which has a profile (cross-section) similar to that of the wire. This may increase the opportunity for the antenna wire to stick to the walls of the channel.

Some Advantages of Forming Channels

Antenna wire does not embed well (using a sonotrode) directly into Teslin™. Therefore, to produce a transponder site, first an antenna channel is created in the Teslin™ with the appropriate number of turns and having a deeper indent in the material at the position where the outer wire of the antenna crosses the antenna wires to reach the chip module for interconnection.

Once a channel is created, the wire conductor (a self bonding wire) can be installed into the channel and simultaneously thermally activated, so that the adhesive layer of the self bonding wire sticks to the walls of the channel.

In the case of Teslin™, a normal insulated wire would not properly embed into the material, it would detach. Therefore, self-bonding wire is used, and attaches to the material with a slight penetration of the wire in the material. In the prior art, to sink the wire into the material, it is necessary that we pre-press the antenna with chip connected using a hot lamination press. With pre-formed channels for accepting the wire, such as using laser ablation, it is not necessary to perform this task.

Profiled/Tapered Channels

FIG. 5 illustrates an example of forming (multiple pass channels). A first path "P1" is shown over a central portion of the channel. A second path "P2" is shown over a left portion of the channel. A third path "P3" is shown over a right portion of the channel. The order of these paths can be different.

Notice that the channel in the figure is "stepped". This represents making several passes with the laser, at a few (such as three) widthwise positions (paths P1,P2,P3). Each pass of the laser may only remove 5 μm of material, in which case 20 passes would be needed to achieve a depth of 100 μm at any given position.

The channel can be rectangular (straight sidewalls). The channel can be tapered, or U-shaped. In FIG. 5, the top half (such as upper 50 μm) of the channel has straight sidewalls, and the lower half (such as bottom 50 μm) of the channel decreases in width as the depth increases, thereby the sidewalls are tapered, and approximate the semicircular profile of the bottom half of the antenna wire (shown in dashed lines). This increases the contact area between the sidewalls of the channel and the antenna wire, which will enhance adhesion of a self-bonding wire in the channel.

Alternatively, masks may be used to block portions of the laser bean and effect a similar stepwise decrease in width accompanying increase in depth.

Some exemplary operating conditions for the laser may be:
  operating the laser at a pulse repetition rate of 30-40 kHz (one pulse every approximately 30 microseconds)
  the duration of each pulse may be approximately 30 picoseconds This low duty cycle (relatively short pulse in a relatively long interval) is advantageous for "cold ablation", where the material is not significantly heated.

The polymer substrate may be porous, facilitating the laser ablation, and the ablation may be performed in an inert atmosphere. Debris can be removed through a suction system.

The antenna wire may be bare (non-insulated wire). The antenna wire may be insulated wire, typically having a copper core coated with a layer of modified polyurethane (an insulating material). The antenna wire may be self-sticking wire, typically having a coating (layer) of polyvinylbutyral. The antenna wire may be insulated and self-sticking, having a coating of polyurethane covered by a coating of polyvinylbutyral. Typical dimensions for a round, insulated, self-sticking wire may be:
  Diameter of copper core: 80 μm
  Thickness of insulating layer of polyurethane: 4 μm
  Thickness of the self-sticking layer of polyvinylbutyral: 4.5 μm Materials other than copper may be used for the wire. Elektrisola (product name: Polysol 155) has been mentioned above. See http://www.elektrisola.com/self-bonding-wire/common-self-bonding-wire-types/iecjis.html The pattern (turns) of the antenna wire may involve the wire crossing over itself, in which case an insulated wire would typically be used. Using channels, such as shown in FIG. 15, the wire may be bare wire, since one the upper channel is sufficiently higher than the lower channel that the wire in the upper channel (shallow portion of the channel) is physically separated from the wire in the lower channel (deep portion of the channel). (If the two bare portions of the antenna wire pass over each other, without touching, there is no subsequent "shorting".) A dab of glue or other electrically insulating material may be disposed on the wire at the crossover between the two portions of wire (such as atop the lower portion). An analogy may be a bridge roadway (analogous to a portion of the wire in an upper portion of the channel) passing over a highway roadway (analogous to a portion of the wire in the lower portion of the channel.

Self-sticking antenna wire may be attached to the walls (sides and/or bottom) of the channel by means of heat (such as hot-air, ultrasonics, UV or IR light) during the process of routing the wire into the channel Heat may be applied to ensure that the antenna wire stays in the channel, at least temporarily, such as until a cover layer is applied and adhered onto the substrate. Lamination of the cover layer onto the substrate will result in the antenna wire will be "trapped" in the channel. The cover layer may be laminated to the inlay substrate carrying the chip module and antenna wire using a hot melt adhesive, such as reactive polyurethane. With a channel having a depth slightly less than the diameter of the wire, the wire will project slightly from the substrate, and a more robust adhering of the wire to the cover layer may be achieved, providing a security feature" that the antenna will be dislodged during de-lamination (presumably for illegal purposes) of the cover layer from the substrate.

The channel for accepting the antenna wire may advertently be made wider (such as 110 μm wide rather than 100 μm wide) at selected areas along the length of the channel so that the antenna wire does not attach well at these wider sections. For example, there may be a series of wider portions, each 1 mm in length, disposed every 5 mm along the length of the channel, at least in a portion of the channel if not along the entire channel. A result of this is that the antenna wire may not stick well in these wider areas, and if an attempt is made to separate the cover layer from the inlay substrate, the antenna wire may tear out of the channel. This may be considered to be a "security feature". Compare FIG. 9A wherein the inlay substrate is perforated to ensure its self-destruction if tampered with.

Connecting the Wire to the Chip Module

Any suitable technique may be used for connecting the antenna wire to the chip module, including some of the techniques of the prior art. As this disclosure is directed mainly to the mounting aspect (getting the wire into the substrate), only a few examples will be presented herein directed to the connecting aspect.

In the aforementioned U.S. Pat. No. 6,088,230, mounting and connecting the antenna wire may be performed as follows:
  starting by bonding a first end of the antenna wire to a first one of two chip terminals,
  then embedding the wire in the substrate to form the turns of the antenna,
  then returning to the chip module and bonding a second end of the antenna wire to the second terminal of the chip module As mentioned above, this process required a "dual purpose" bonding/embedding tool.

According to an embodiment of the invention, mounting and connecting the antenna wire may be performed as follows:
- starting by bonding a first end of the antenna wire to a first one of two chip terminals,
- then routing the wire into pre-formed channels in the substrate to form the turns of the antenna,
- then returning to the chip module and bonding a second end of the antenna wire to the second terminal of the chip module This would avoid the need for a complicated "dual purpose" bonding/embedding tool.

FIG. 6A shows a chip module having two terminals disposed in a recess in a substrate. This recess is shown as extending completely through the substrate, hence an underlying support layer is included. A channel for accepting a wire is shown extending from the right (as viewed) side of the recess. The channel may be formed by laser ablation. The recess may also be formed by laser ablation.

A short length of "residual" wire is shown extending from a wire feed mechanism, such as the capillary of a sonotrode. An exemplary mounting operation may proceed as follows:
- with a residual first end portion of the wire extending from the capillary positioned directly over the chip terminal, the capillary is lowered to begin laying the wire in the channel.
- the turns of the antenna are formed, following the pattern of the channel
- the capillary returns to the chip module and positions a second end portion of the wire directly over the second terminal of the chip module. (omitted, for illustrative clarity)
- then, in a connecting phase, a thermode is brought down onto the end portions of the wire to bond them to the terminals of the chip module. (See FIG. 1A)

FIG. 6B shows that a suction system may be employed to create an airflow maintaining the "floating" end portions of the wires above the corresponding terminals of the chip module, for bonding thereto.

FIG. 6C shows a chip module 608 disposed in a recess 606 in a substrate 602. The chip module has two terminals 608a and 608b. A channel 652 is formed in the surface of the substrate. An antenna 610 may be mounted in the channel and connected to the chip module, as follows:
- a dab (or spot) of glue 620 is disposed on the chip module 608, such as on the mold mass, between the terminals. One relatively large spot of glue may be disposed approximately in the middle of the chip module 608, and extending beyond the side edges of the chip module, and slightly onto the inlay substrate 602
- stick a first end of the antenna wire 610 into the dab of glue 620. This can be done with the wire placing tool, while applying heat. The dashes "-" indicate that the antenna wire is stuck (not embedded, not bonded) in the dab of glue.
- using the wire guide tool, draw (guide) the antenna wire 610 over the first terminal 608a of the chip module 608. This results in a first end portion 610a of the antenna wire 610 being disposed over the first terminal 608a of the chip module 608.
- then guide the antenna wire 610 away from the chip module 608 onto the inlay substrate 602, laying the wire in the channel 652 and forming the turns of the antenna, commending at the point "c"
- return to the chip module, and with the wire guide tool, draw (guide) the antenna wire 610 over the second terminal 608b of the chip module 608. This results in a second end portion 1010b of the antenna wire 1010 being disposed over the second terminal 1008a of the chip module 1008
- cut the antenna wire 610. Optionally, prior to cutting the wire, stick the second end of the wire into the dab of glue.
- In a second (connecting) phase, connect (bond) the end portions of the wire to the terminals.

FIGS. 7A-7C illustrate another technique 700 for mounting and connecting an antenna wire. A stepped recess 706 for a chip module 708 is formed in a substrate 702 and has an upper portion 706a and a lower portion 706b. The recess 706 may be formed by laser ablation. In conjunction with forming the recess 706, a channel (752) for accepting the antenna wire (710) is formed.

A first portion 752a of the channel (752) extends into the surface of the substrate 702, and continues (as an "extension" 752a' of the portion 752a) into the surface of the lower portion 706b of the recess 706. A second portion 752b of the channel (752) extends into the surface of the substrate 702, and continues (as an "extension" 752b' of the portion 752b) into the surface of the lower portion 706b of the recess 706.

When the wire (710) is laid into the channel (752), a first end portion 710a of the wire is laid into the extension 752a' of the first portion 752a of the channel, and a second end portion 710b of the wire is laid into the extension 752b' of the second 752b of the channel. (The wire is omitted from the view of FIG. 7B, for illustrative clarity.)

The channel and recess may be formed sequentially. For example, first form the channel for accepting the antenna wire in the surface of the substrate, then after laying down the wire in the antenna channel (104 cm), the stepped recess is created in the polymer substrate to accept the chip module. During forming the recess, the end portions of the wire are "in the way" and the self bonding layer and insulation layer will be removed from the wire at the positions where the end portions of the antenna wire will exposed to the terminal areas of the chip module. Then the chip module may be installed in the recess and connected with the end portions of the antenna wire.

Alternatively, as illustrated, the channels and recess are fully formed before the antenna wire is laid into the channels.

Another alternative may be to connect the end portions of the antenna wire to the terminal areas of the chip module prior to installing the chip module into the recess. (The chip module would be supported immediately above the recess during connecting the wire to the terminals and laying the wire into the antenna channel.)

FIG. 7C shows that after the wire is laid into the channel, the chip module 708 may be installed into the recess 706, with the mold mass down. The orientation with mold mass down is similar to FIG. 1D, but in FIG. 7C the end portions of the wire to be connected to the leadframe are on the mold mass (down) side of the leadframe.

The wire may be self-bonding wire. In the process of forming the recess and channel, and laying the wire, additionally insulation (the self bonding layer and insulation layer) may be removed from the top (exposed) surface of the end portions of the wire to facilitate connecting to terminal areas of the leadframe.

Two terminal areas 708a and 708b are illustrated. These are essentially portions of the leadframe. A hole 709a is created through the terminal area 708a to expose a portion of the underlying end portion 710a of the wire. A hole 709b is created through the terminal area 708b to expose a portion of the underlying end portion 710b of the wire. The end portions 710a and 710b may be connected in any suitable manner to the corresponding terminal areas 708a and 708b of the leadframe (of the chip module 708). For example, by soldering. Or, a beam from a laser 760 can be directed through the holes 709a and 709b in the respective terminal areas 708a and 708b to effect the connection (laser welding) of end portions 710a and 710b to terminal areas 708a and 708b.

The holes 709a and may be micro holes which are percussion drilled into the metal leadframe of the chip module at each terminal area. This allows for the welding, soldering or crimping of the leadframe terminals to the respective end portions of the antenna wire. For the interconnection per welding, the laser beam is directed into the hole, causing the copper wire to reach its melting point in a matter of nanoseconds (ns), picoseconds (ps) or femtoseconds (fs). The chip module with the micro holes may be placed over the wires for interconnection.

Some exemplary dimensions are:
overall thickness "a" of the substrate 702, approximately 356 μm
depth of an upper portion 752a of the channel 752 extending into the top surface of the substrate 702, approximately 100 μm
depth "b" of an upper portion 706a of the recess 706 which accepts the leadframe, approximately 80-100 μm
depth "c" of portion 752b of the channel 752 in the bottom of the upper portion 706a of the recess 706, approximately 100 μm to accommodate a wire have a diameter of approximately 80 μm
depth "d" of a lower portion 706b of the recess 706 which accommodates the mold mass of the chip module, approximately 180 μm (from the bottom of the upper portion 706a)
a remaining thickness "e" of the substrate 702 under the lower portion 706b of the recess, approximately 100 μm.
the total thickness "a" equals the depth "b" of the upper portion 706a plus the depth "d" of the lower portion 706b plus the thickness "e" of the remaining portion 702b of the substrate under the lower portion 706b.

Notice in FIG. 1D that the end portions of the wire are connected on an opposite side of leadframe than the mold mass. And, in FIG. 7C, the end portions of the wire are connected on the same side of leadframe as the mold mass The channels and recess in the substrate may be ablated with a nanosecond (ns), picosecond (ps) or femtosecond (fs) laser operating at UV (ultraviolet), VIS (visible) or IR (infrared). The substrate may be a polymer, such as porous (Teslin™) or non-porous (polycarbonate) or can be doped to facilitate the laser ablation process. The ablation can take place in an inert atmosphere and the polymer can be heated or chilled prior to laser treatment. Laser ablation is particularly good with a porous polymer, as its porosity facilitates the ablation process.

It should be understood that some of the techniques described hereinabove for forming channels and routing the antenna wire into the channel may be performed in a layer (or film) of adhesive on an inlay substrate rather than in the substrate itself.

Some Additional Features which May be Formed Using Laser Ablation

In addition to forming recesses and/or channels for accepting wire, other mechanical and security features may be incorporated into the inlay, using laser ablation.

Trenches for De-Stressing the Substrate Layer During Hot Lamination

FIG. 8 illustrates a recess formed in an inlay substrate. The inlay substrate may be for a national ID card, and may comprise Teslin™ or polycarbonate (PC). The recess may, for example, be 5 mm×8 mm. The chip module may be an epoxy-glass module, and is omitted, for illustrative clarity.

Trenches (grooves, channels, slots, perforations, small recesses) may be formed near (adjacent, next to) the recess, such as within a few millimeters thereof. The trenches may be short line segments, such as 0.5 mm wide by 2 mm long, and arranged in a pattern radiating from the periphery of the recess. The trenches may be oriented differently than shown. The trenches may extend to near the perimeter of the recess, or may extend completely to the recess. Both variations of trenches are shown in FIG. 8.

The trenches extend at least partially through the inlay substrate (from the front surface thereof towards the back surface thereof), and may provide stress relief to de-stress the inlay substrate layer during hot lamination of the cover layer to the inlay substrate. For example, for an 80 μm thick inlay substrate, the "stress-relief" trenches may extend only approximately 40 μm through the substrate.

The trenches may allow for flexure of the inlay substrate, such as during hot lamination, without buckling, which otherwise may result in a bumpy or dented front surface of the substrate.

The stress-relief trenches constitute what may be referred to as a "mechanical feature" of an inlay substrate.

Perforations to Prevent De-Peeling (or Delamination)

FIGS. 9A,B,C illustrate a "protected area" around a chip module connected to an antenna in an inlay substrate. The inlay substrate (e-cover inlay) may be for an electronic passport, and may comprise Teslin™. The inlay substrate is adhesively attached to a passport cover material.

At the protected area, a recess may for example, be rectangular to accommodate the chip module connection areas on a leadframe or printed circuit board, having a recess depth of approximately 60 microns in the Teslin™ layer. The chip module may be an epoxy-glass module.

Perforations (trenches, grooves, channels, slots, small recesses) may be formed around the protected area, such as within a few millimeters thereof. The perforations may be short line segments, such as 0.5 mm wide by 0.5 mm long, and arranged in any suitable pattern at least partially encircling the protected area. Alternatively, the perforations may be in a line (or lines) passing across the protected area. The perforations can be other than straight line segments, such as "s" shaped, and may overlap and/or intersect each other.

The perforations may extend fully through the inlay substrate (from the front surface thereof towards the back surface thereof).

If an attempt is made to peel the inlay substrate from the cover material, the perforations may encourage (cause) the inlay substrate to tear. The perforations represent points (or areas) of weakness, making the inlay substrate frangible (capable of being easily broken).

The perforations constitute what may be referred to as a "security feature" of an inlay substrate.

At the protected area, the chip module is connected to the antenna and if any attempt is made to peel the inlay substrate from the cover material, the wire interconnections to the chip module are destroyed, resulting in permanent damage to the chip module.

FIG. 9C illustrates (generally) initiating peeling the cover material layer from the inlay substrate, and consequent destruction of the inlay substrate which is facilitated by the perforations.

As best viewed in FIG. 9A, both ends of the antenna wire may approach the chip module from the same side of the recess. (Of course, in the case of a round recess, from the same direction.)

Notches for Holding the Chip Module in Position

FIGS. 10A and B illustrates a recess formed in an inlay substrate. The inlay substrate may be for a national ID card, and may comprise Teslin™ or polycarbonate (PC).

The recess may, for example, be 5 mm×8 mm. The chip module may be an epoxy-glass module, and is omitted, for illustrative clarity.

Notches may be formed in a manner similar to other laser ablated features (such as the aforementioned trenches, grooves, channels, slots, perforations, small recesses). The notches may extend from one or more side edges of the recess to external the recess. The notches may semicircular, or triangular (for example), having a cross-dimension (base, height, diameter) of approximately 1 mm.

The notches may extend at least partially through the inlay substrate (from the front surface thereof towards the back surface thereof). For example, for an 80 μm thick inlay substrate having a 60 μm deep pocket-type recess, the notches may extend as deep as the recess.

Pins, such as wedge-shaped pins, may be inserted into the notches which will decrease the cross-dimension of the recess, thereby holding the chip module in place, such as for further handling (applying adhesive and cover layer).

The pins would have a cross-dimension (diameter) slightly greater than the cross-dimension of the notch, so that when a pin is inserted into the notch, the inlay substrate material between the notch and the recess deflects towards the chip module, holding (pinching) it in place.

The notches (and pins) may eliminate the need for gluing the chip module in place and allowing for easy handling of the inlay substrate during wire embedding and interconnection processes.

The notches constitute what may be referred to as a "mechanical feature" of an inlay substrate.

Slots for Holding the Chip Module in Position

FIG. 11A,B illustrates a recess formed in an inlay substrate. The inlay substrate may be for a national ID card, and may comprise Teslin™ or polycarbonate (PC).

The recess may, for example, be 5 mm×8 mm. The chip module may be an epoxy-glass module, and is omitted, for illustrative clarity.

Slots may be formed in a manner similar to other laser ablated features (such as the aforementioned notches, trenches, grooves, channels, perforations, small recesses). The slots may be disposed outside of the recess, but near to the recess. The slots may be rectangular, measuring 5-8 mm×1 mm.

The slots may extend at least partially through the inlay substrate (from the front surface thereof towards the back surface thereof). For example, for an 80 μm thick inlay substrate having a 60 μm deep pocket-type recess, the slots may extend as deep as the recess.

In a manner similar to the notches/pins described above (FIG. 13), the slots may eliminate the need for gluing the chip module in place, especially when moving inlay substrates with a format of transponder sites from one production process to the next. Further, using glue to adhesively attach a chip module to an inlay substrate has the disadvantage that the surface finish of the inlay substrate after lamination highlights the position of the chip module in an electronic passport or national identity card which is a security risk.

Optionally, pins, such as wedge-shaped pins, may be inserted into the slots which will decrease the cross-dimension of the recess, thereby holding the chip module in place, such as for further handling (applying adhesive and cover layer).

The pins would have a cross-dimension (diameter) slightly greater than the cross-dimension of the slots, so that when a pin is inserted into the slots, the inlay substrate material between the slots and the recess deflects towards the chip module, holding (pinching) it in place.

The slots constitute what may be referred to as a "mechanical feature" of an inlay substrate.

Some Additional Mechanical and Security Features

A hologram may be created using the laser on the underside of the inlay substrate, such as opposite the chip module. This would create a visible "security feature".

Some inlay substrates comprise polycarbonate, and tend to develop micro cracks in the area of the chip module (around the recess). To reduce the formation of (prevent) micro cracks developing in polycarbonate (PC), at the position of the chip module (around the edge of the recess), the material of the substrate can be laser treated, a form of annealing it at the threshold fluence (just below ablating, with incubation effect).

FIG. 12A shows a chip module 1208 installed in a recess 1206 of an inlay substrate 1202. A side extension, or edge region 1230 of the substrate may be thinned by laser ablation such as to a fraction of the substrate's original thickness, such as to approximately 50% of the original thickness. A laser 1250 is shown ablating from the top (as viewed) surface of the substrate, but it will be understood that the ablating could occur from the bottom surface of the substrate 1202, or from both the top and bottom surfaces of the substrate 1202. By thinning the substrate at an edge region, an "overlap joint" may be made with another element, such as a flap of plastic material 1270 (shown in dashed lines). Reference is made to U.S. Pat. No. 6,213,702, incorporated by reference herein.

FIG. 12B shows that laser ablation may be used to create "studs" 1232 along the edge region 1230 of the substrate 1202 for inserting into holes of a separate element (not shown, such as a plastic flap).

FIG. 12C shows that laser ablation may be used to create holes 1234 along the edge region 1230 of the substrate 1202 for receiving mating studs of a separate element (not shown, such as a plastic flap).

Generally, laser ablation may be used to thin an entire region of the substrate, and to form 3-dimensional features such as studs in a thinned region of the substrate, or to form holes in a thinned region of the substrate. Each of these would constitute a "mechanical feature" of an inlay substrate which may be used to create an interlocking clamp between a flap and a data page inlay using laser ablated studs and recesses.

While the invention has been described with respect to a limited number of embodiments, these should not be construed as limitations on the scope of the invention, but rather as examples of some of the embodiments. Those skilled in the art may envision other possible variations, modifications, and implementations that are also within the scope of the invention, based on the disclosure(s) set forth herein.

What is claimed is:

1. An inlay substrate for a secure document having a recess extending into the inlay substrate from a first surface thereof for receiving a chip module therein, and for receiving an antenna wire disposed in the inlay substrate and connected with the chip module, the inlay substrate comprising at least one of the following features incorporated into the inlay substrate:
- trenches disposed in the inlay substrate, near the recess, for de-stressing the inlay substrate layer during hot lamination;
- perforations disposed in the inlay substrate, around the recess, for making a recess area of the substrate frangible;
- notches disposed in the inlay substrate, in side edges of the recess, and pins inserted into the notches for resiliently holding the chip module in place; and
- slots disposed in the inlay substrate, around at least one side edge of the recess for resiliently holding the chip module in place.

2. The substrate of claim 1, wherein the trenches, perforations, notches and/or slots are formed by laser ablation.

3. The inlay substrate of claim 1, wherein:
the features are trenches formed in the inlay substrate; and
the trenches are formed within a few millimeters of the recess.

4. The inlay substrate of claim 1, wherein:
the features are trenches formed in the inlay substrate; and
the trenches are approximately 0.5 mm wide and approximately 2 mm long.

5. The inlay substrate of claim 1, wherein:
the features are trenches formed in the inlay substrate; and
at least some of the trenches extend to the recess.

6. The inlay substrate of claim 1, wherein:
the features are trenches formed in the inlay substrate; and
the trenches extend at least partially through the inlay substrate.

7. The inlay substrate of claim 1, wherein:
the features are trenches formed in the inlay substrate; and
the trenches provide at least one of (i) de-stressing the inlay substrate layer during hot lamination of a cover layer to the inlay substrate, (ii) allowing for flexure of the inlay substrate without buckling.

8. The inlay substrate of claim 1, wherein:
the features are perforations disposed in the inlay substrate; and
the perforations at least partially encircle the recess.

9. The inlay substrate of claim 1, wherein:
the features are perforations disposed in the inlay substrate; and
the perforations extend fully through the inlay substrate.

10. The inlay substrate of claim 1, wherein:
the features are perforations disposed in the inlay substrate; and
selected ones of the perforations overlap or intersect other ones of the perforations.

11. An electronic passport cover comprising:
a cover layer; and
the inlay substrate of claim 1, wherein:
the features are perforations disposed in the inlay substrate; and
peeling the cover layer from the inlay substrate results in at least partial destruction at least one of the substrate and wire interconnections to the chip module.

12. The inlay substrate of claim 1, wherein:
the features are notches in the inlay substrate and pins inserted into the notches; and
the notches extend from one or more side edges of the recess to external the recess.

13. The inlay substrate of claim 1, wherein:
the features are notches in the inlay substrate and pins inserted into the notches; and
the notches have a cross-dimension of approximately 1 mm.

14. The inlay substrate of claim 1, wherein:
the features are notches in the inlay substrate and pins inserted into the notches; and
the notches extend at least partially through the inlay substrate.

15. The inlay substrate of claim 1, wherein:
the features are notches in the inlay substrate and pins inserted into the notches; and
the pins have a cross-dimension slightly greater than a cross-dimension of the notches, so that when a pin is inserted into a notch, the inlay substrate material between the notch and the recess deflects towards the chip module, holding the chip module in place.

16. The inlay substrate of claim 1, wherein:
the features are slots in the inlay substrate; and
the slots are rectangular, measuring approximately 5-8 mm×approximately 1 mm.

17. The inlay substrate of claim 1, wherein:
the features are slots in the inlay substrate; and
the slots extend at least partially through the inlay substrate.

* * * * *